(12) United States Patent
Lai et al.

(10) Patent No.: US 12,176,286 B2
(45) Date of Patent: Dec. 24, 2024

(54) MEMORY DEVICE AND METHOD OF FORMING THE SAME

(71) Applicant: Taiwan Semiconductor Manufacturing Company, Ltd., Hsinchu (TW)

(72) Inventors: Li-Shyue Lai, Hsinchu Country (TW); Chien-Hao Huang, Hsinchu (TW); Chia-Yu Ling, Hsinchu (TW); Katherine H Chiang, New Taipei (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 260 days.

(21) Appl. No.: 17/669,382

(22) Filed: Feb. 11, 2022

(65) Prior Publication Data

US 2023/0038958 A1  Feb. 9, 2023

Related U.S. Application Data

(60) Provisional application No. 63/230,073, filed on Aug. 6, 2021.

(51) Int. Cl.
 *H10B 51/20* (2023.01)
 *H01L 23/522* (2006.01)
 *H01L 23/528* (2006.01)
 *H10B 51/30* (2023.01)

(52) U.S. Cl.
 CPC ...... *H01L 23/5283* (2013.01); *H01L 23/5226* (2013.01); *H10B 51/20* (2023.02); *H10B 51/30* (2023.02)

(58) Field of Classification Search
 CPC . H01L 23/5283; H01L 23/5226; H10B 51/20; H10B 51/30; H10B 63/30; H10B 51/50
 See application file for complete search history.

(56) References Cited

U.S. PATENT DOCUMENTS

| 9,601,370 B2 * | 3/2017 | Kato | H01L 21/76816 |
| 11,735,240 B2 * | 8/2023 | Tang | H01L 29/40117 |
| | | | 257/324 |
| 2021/0257382 A1 * | 8/2021 | Zhou | H10B 43/27 |
| 2021/0265268 A1 * | 8/2021 | Su | H01L 23/5283 |
| 2021/0399015 A1 * | 12/2021 | Lin | H10B 51/50 |
| 2021/0399016 A1 * | 12/2021 | Jiang | H10B 41/10 |

* cited by examiner

*Primary Examiner* — Meiya Li
*Assistant Examiner* — Valeria Gabriela Stoleru
(74) *Attorney, Agent, or Firm* — JCIPRNET

(57) ABSTRACT

A memory device includes an alternating stack of dielectric layers and word line layers, pairs of bit lines and source lines spaced apart from one another, a data storage layer covering a sidewall of the alternating stack, and channel layers interposed between the data storage layer and the pairs of bit lines and source lines. The alternating stack includes a staircase structure in a staircase-shaped region, and the staircase structure steps downward from a first direction and includes at least one turn. The pairs of bit lines and source lines extend in a second direction that is substantially perpendicular to the first direction and are in lateral contact with the data storage layer through the channel layers. A semiconductor structure and a method are also provided.

20 Claims, 24 Drawing Sheets

MEMORY DEVICE AND METHOD OF FORMING THE SAME

CROSS-REFERENCE TO RELATED APPLICATION

This application claims the priority benefit of U.S. provisional application Ser. No. 63/230,073, filed on Aug. 6, 2021. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon. The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-7A, 8A, 9A, 10A, 11A, and 12A illustrate schematic perspective views of a memory device at various stages of manufacturing, in accordance with some embodiments.

DETAILED DESCRIPTION

Figure 1:
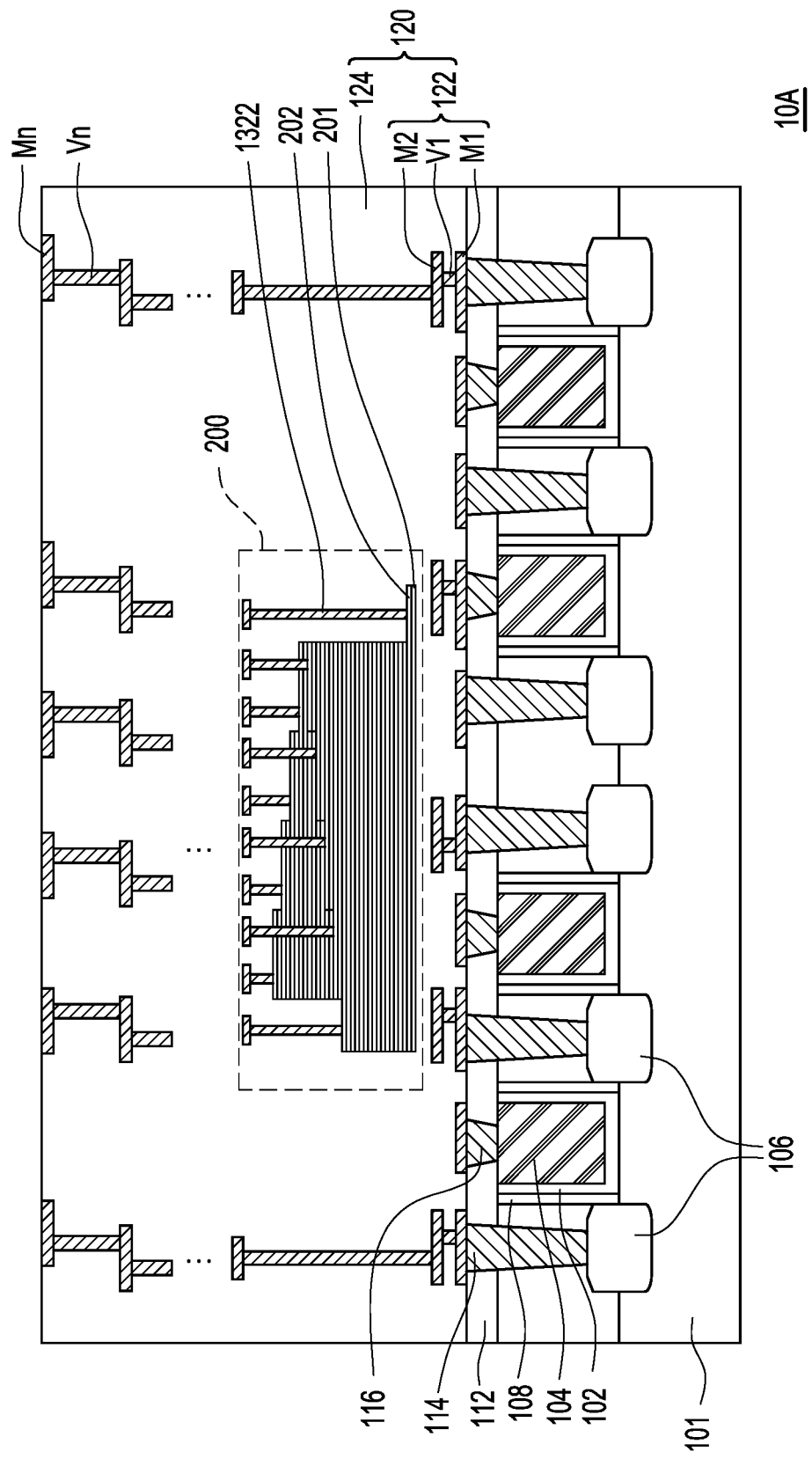
FIG. 1 illustrates a schematic cross-sectional view of a semiconductor structure including a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a schematic cross-sectional view of a semiconductor structure including a memory device, in accordance with some embodiments. Referring to FIG. 1, a semiconductor structure 10A includes a substrate 101. The substrate 101 may be a semiconductor substrate, such as a bulk semiconductor, a semiconductor-on-insulator (SOI) substrate, or the like, which may be doped (e.g., with a p-type or an n-type dopant) or undoped. The SOI substrate is a layer of a semiconductor material formed on an insulator layer. The insulator layer may be, for example, a buried oxide (BOX) layer, a silicon oxide layer, or the like. The insulator layer is provided on a substrate, typically silicon or glass substrate. In some embodiments, the semiconductor material of the substrate 101 includes silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as a multi-layered or gradient substrate may also be used.

The substrate 101 may be or may include an integrated circuit die, such as a logic die, a memory die, an ASIC die, or the like. The substrate 101 may be or may include a complementary metal oxide semiconductor (CMOS) die and may be referred to as a CMOS under array (CUA). For example transistors are formed at a top surface of the substrate 101 through front-end-of-line (FEOL) processes. The transistors may include gate dielectric layers 102 over top surfaces of the substrate 101 and gate electrodes 104 over the gate dielectric layers 102. Source/drain regions 106 may be formed in the substrate 101 on opposite sides of the gate dielectric layers 102 and the gate electrodes 104. Gate spacers 108 may be formed along sidewalls of the gate dielectric layers 102 and separate the source/drain regions 106 from the gate electrodes 104 by appropriate lateral distances. The transistors may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes. The illustrated transistors are merely example, and other type(s) of the transistors may be employed, in accordance with some embodiments.

The semiconductor structure 10A may include a first inter-layer dielectric (ILD) 110 which surrounds and isolates the source/drain regions 106, the gate dielectric layers 102, and the gate electrodes 104. In some embodiments, a second ILD 112 is formed over the first ILD 110. Source/drain contacts 114 may extend through the second ILD 112 and the first ILD 110 and may be electrically coupled to the source/drain regions 106. Gate contacts 116 may extend through the second ILD 112 and may be electrically coupled to the gate electrodes 104. An interconnect structure 120 may be formed over the second ILD 112, the source/drain contacts 114, and the gate contacts 116. The interconnect structure 120 may include one or more stacked dielectric layers 124 and conductive features 122 embedded in the one or more dielectric layers 124. The conductive features 122 may include conductive lines (e.g., M1, M2, Mn) and conductive vias (e.g., V1, Vn). For example, the conductive features 122 include conductive material(s) such as copper, aluminum, nickel, tungsten, alloys thereof, and/or the like. For example, back-end-of-line (BEOL) processes are performed to form multilayered interconnect features that interconnects various elements formed by the FEOL processes.

The interconnect structure 120 may be electrically connected to the gate contacts 116 and the source/drain contacts 114 to form functional circuits. In some embodiments, the functional circuits formed by the interconnect structure 120 may include logic circuits, memory circuits, sense amplifiers, controllers, input/output circuits, image sensor circuits, the like, or combinations thereof. Although FIG. 1 discusses transistors formed over the substrate 101, other active devices (e.g., diodes or the like) and/or passive devices (e.g., capacitors, resistors, or the like) may also be formed as part of the functional circuits.

In some embodiments, the semiconductor structure 10A includes a memory device 200 formed over the substrate 101 and embedded in the dielectric layers 124 of the interconnect structure 120. The memory device 200 may include a plurality of memory cells arranged in a grid of rows and columns, where the memory cells may be stacked vertically to provide a three-dimensional (3D) memory array, thereby increasing device density. For example, the memory device 200 is formed by the BEOL process and is electrically coupled to the underlying transistors through the conductive features 122 of the interconnect structure 120. The memory device 200 may be controlled or accessed (e.g., written to or read from) by functional circuits of the semiconductor structure 10A. Alternatively, the memory device 200 is electrically coupled to conductive pads (not labeled) formed over the top of the interconnect structure 120, in which case the memory device 200 is controlled or accessed by an external circuit (e.g., another semiconductor device) directly without involvement of the functional circuits of the semiconductor structure 10A. Although additional conductive features 122 are formed over the memory device 200 in the example of FIG. 1, the memory device 200 may be formed in a top (e.g., topmost) layer of the semiconductor structure 10A, these and other variations are fully intended to be included within the scope of the present disclosure.

In some embodiments, the memory device 200 includes word line layers 202 spaced apart from each other through dielectric layers 201 in the z-direction of the semiconductor structure 10A, where the alternating stack of the word lines layers 202 and the dielectric layers 201 may form multiple series of alternating steps and risers elongated respectively in the x-direction and z-direction. The word line layers 202 in the staircase-shaped region may be formed in a zigzag manner. It should be noted that the memory device 200 in FIG. 1 is shown for illustrative purposes in order to explain the zigzag configuration, and not all features of the memory device 200 are illustrated for simplicity. The details of the staircase word lines are described below in accompanying with perspective views.

In some embodiments, each of contact vias 1322 is formed on one of the word line layers 202 in the staircase-shaped region. In contrast to the conventional staircase word lines where the steps of the staircase word lines step downward in a strip shape from the memory array region to the peripheral region, the word line layers 202 in the staircase-shaped region having a zigzag configuration (e.g., including at least one turn) may be more space efficient and provide a compact layout for the contact vias landing thereon. The turn angle of the zigzag configuration may be 0°, 90°, 180°, or 270° (not inclusive). Embodiments are discussed below in the context of forming a memory device with staircase word lines arranged in a zigzag manner. Some variations of embodiments are also discussed and the intermediate stages of forming the memory device are illustrated. It should be appreciated that the illustration throughout the drawings are schematic and not in scale.

Figure 2:
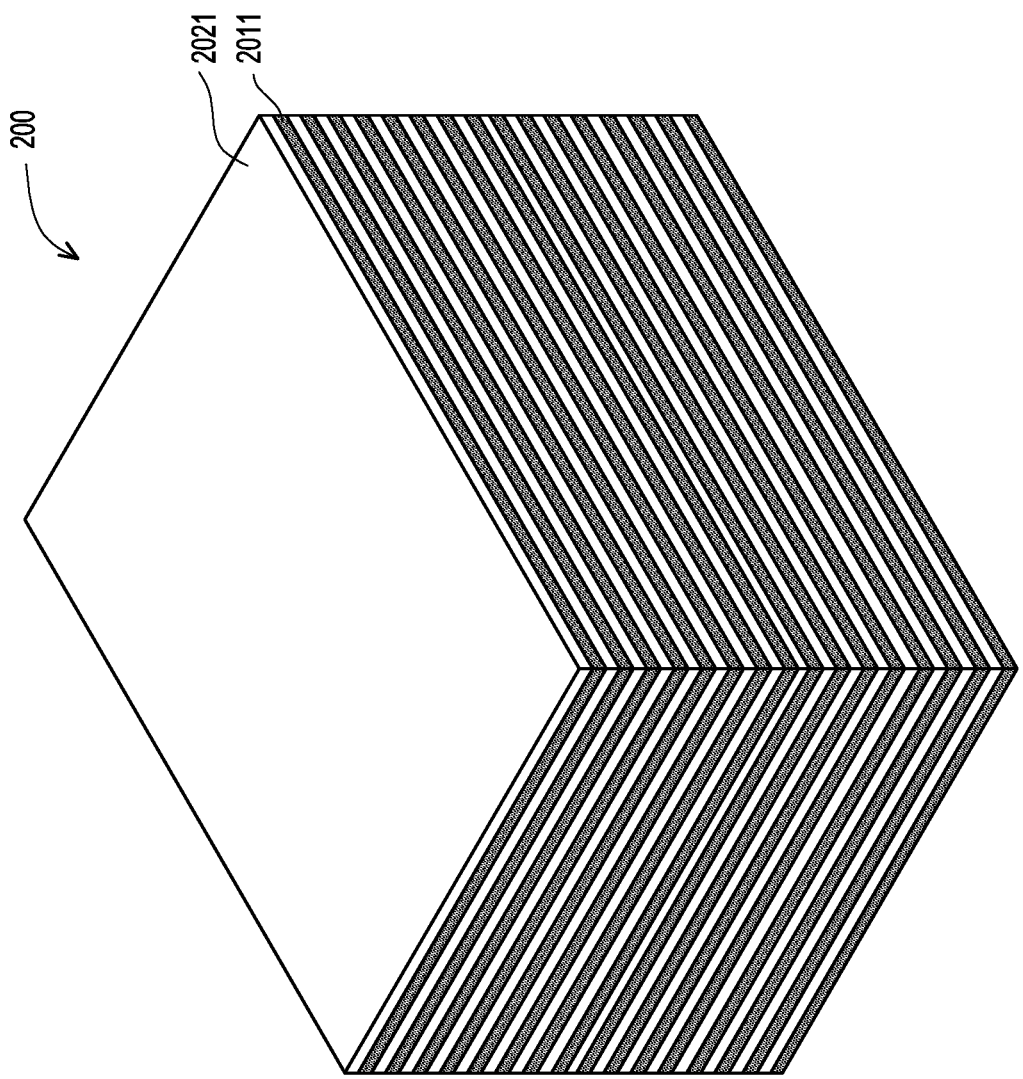

FIGS. 2-12 illustrate various views (e.g., perspective view and top view) of the memory device 200 at various stages of manufacturing, in accordance with some embodiments. Referring to FIG. 2, which shows a perspective view of the memory device 200 at an early stage of fabrication. In some embodiments, a multi-layered stack is formed over the substrate (not shown; labeled as 101 in FIG. 1). Note that the substrate may not be considered part of the memory device 200, and thus the substrate is not illustrated in the figures. For example, the multi-layered stack includes an alternating stack of dielectric material layers 201l and conductive material layers 202l. It should be understood that the structure shown in FIG. 2 is a partial view of the multi-layered stack, where the topmost layer of the multi-layered stack is not necessary to be the conductive material layer 202l and the bottommost layer of the multi-layered stack is not necessary to be the dielectric material layer 201l. That is, the dielectric material layer 201l may be formed at the topmost layer stack and the conductive material layer 202l may be formed at the bottommost layer stack.

In some embodiments, to form the multi-layered stack, the dielectric material layer 201l is first formed by depositing a suitable dielectric material, such as silicon oxide, silicon nitride, or the like, using a suitable deposition method, such as chemical vapor deposition (CVD), atomic layer deposition (ALD), physical vapor deposition (PVD), or the like. The conductive material layer 202l is then formed over the dielectric material layer 201l by, e.g., PVD, CVD, ALD, combinations thereof, or the like. The conductive material layer 202l may be formed of an electrically conductive material, such as a metal or metal-containing material including Al, Ti, TiN, TaN, Co, Ag, Au, Cu, Ni, Cr, Hf, Ru, W, Pt, or the like. The aforementioned steps may repeat several times to form the multi-layered stack.

Figure 3:
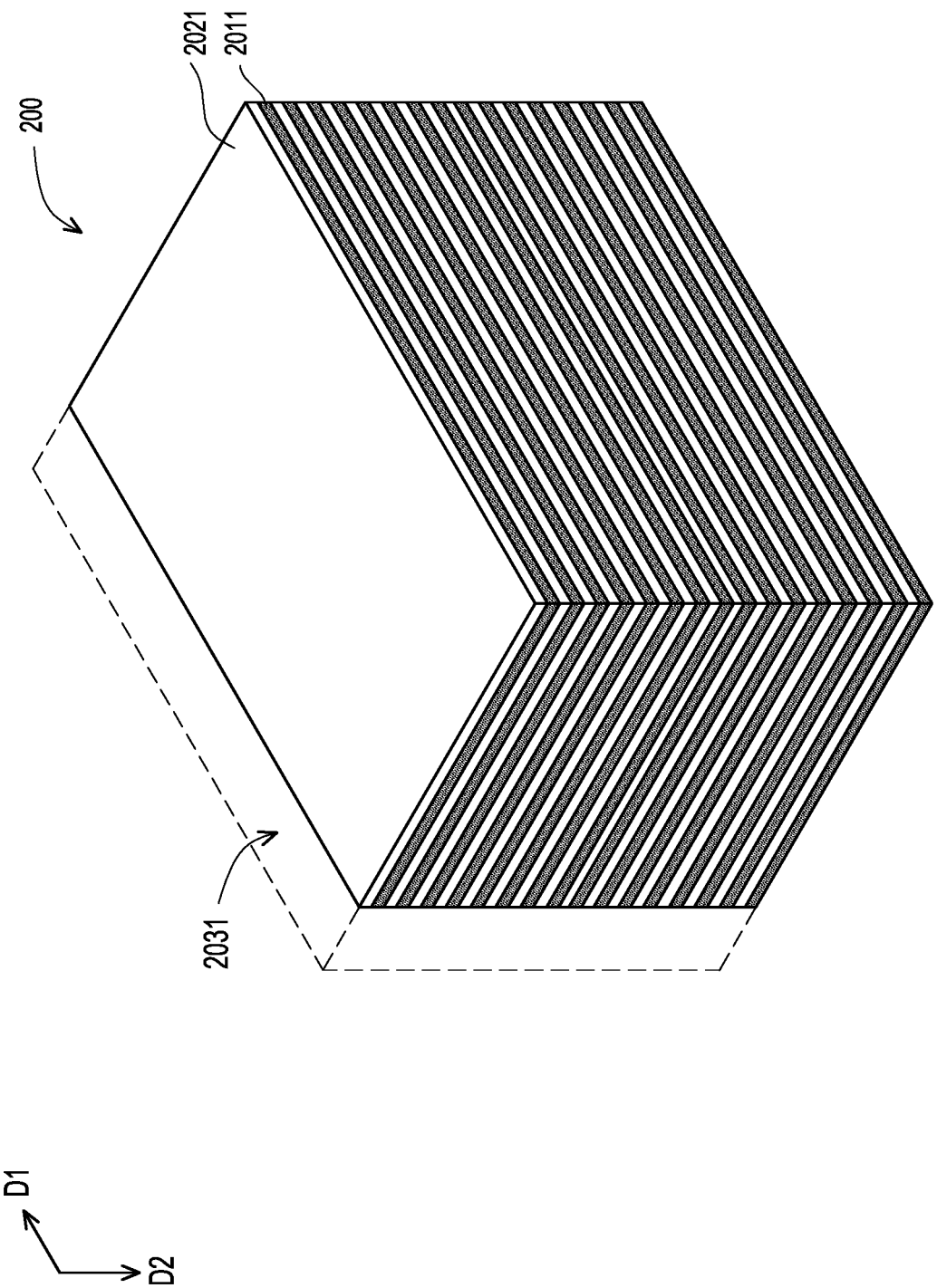

Referring to FIG. 3 and with reference to FIG. 2, a portion of the multi-layered stack is removed to form a trench 203t (also referred to as an opening, a recess, or a slot) therethrough by using any suitable removal technique. For example, the longitudinal axis of the trench 203t extends along the first direction D1. The trench 203t may extend continuously along the stacking direction of the multi-layered stack (i.e. the second direction D2), such that the trench 2031 cut through the multi-layered stack. Although only one trench is illustrated herein, it should be understood that a plurality of trenches may be formed in a parallel manner and separate the multi-layered stack into a plurality of slices (only one slice is shown) that are spatially spaced apart from one another.

Figure 4:
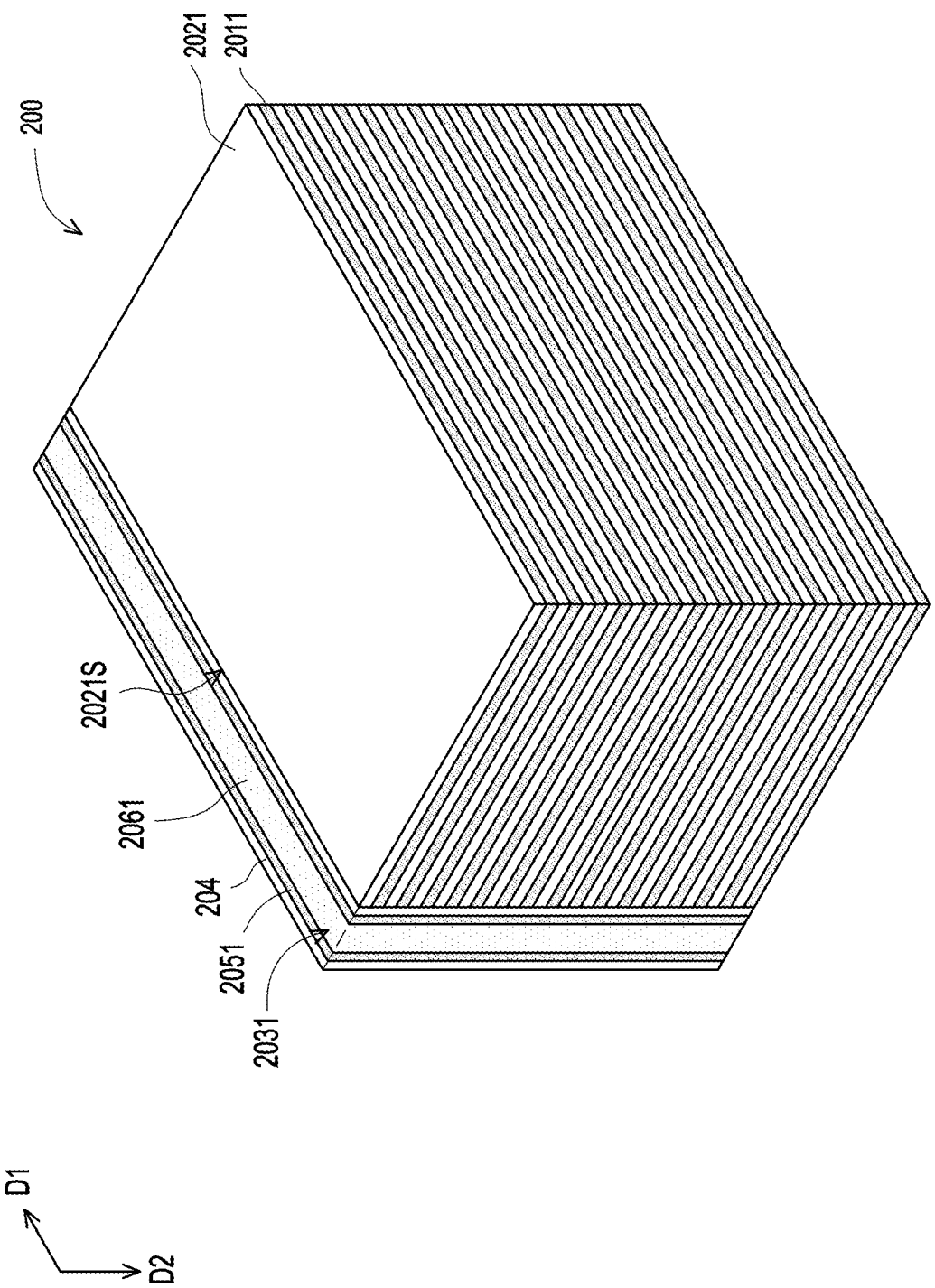

Referring to FIG. 4 and with reference to FIG. 3, a data storage layer 204, a channel material layer 2051, and a dielectric material layer 2061 may be sequentially formed in the trench 2031. For example, the data storage layer 204 is conformally formed in the trench 2031 by a suitable method such as PVD, CVD, ALD, or the like. The data storage layer 204 may cover the exposed sidewalls 2012S of the multi-layered stack that define the trench 2031 and may be in direct contact with the exposed sidewalls of the dielectric material layers 2011 and the conductive material layer 2021. Next, the channel material layer 2051 may be conformally formed over the data storage layer 204 by, e.g., PVD, CVD, ALD, combinations thereof, or the like. Subsequently, the dielectric material layer 2061 may be formed over the channel material layer 2051 to fill the trench 2031 using a suitable method, such as PVD, CVD, ALD, or the like. In some embodiments, a planarization process (e.g., chemical mechanical polish (CMP), an etch-back process, combinations thereof, or the like) is performed to remove excess portions of the data storage layer 204, excess portions of the channel material layer 2051, and excess portions of the dielectric material layer 2061 from the topmost surface of the multi-layered stack.

Depending on the type of the memory device 200, the data storage layer 204 may include any suitable switching material such as ferroelectric materials (e.g., hafnium based dielectric materials and/or the like), resistive materials (e.g., metal oxide, polymer, etc.), phase change random access memory materials, conductive-bridging random access memory materials, magnetic material, or the like. The channel material layer 2051 may be or may include a semiconductive material (e.g., amorphous-silicon (a-Si), polysilicon (poly-Si)), a semiconductive oxide (e.g., indium gallium zinc oxide (IGZO), indium zinc oxide (IZO), zinc oxide (ZnO), indium tin oxide (ITO), or indium tungsten oxide (IWO)), or the like. The dielectric material layer 2061 may include silicon oxide, silicon nitride, silicon oxynitride, a combination thereof, and/or the like.

Figure 5:
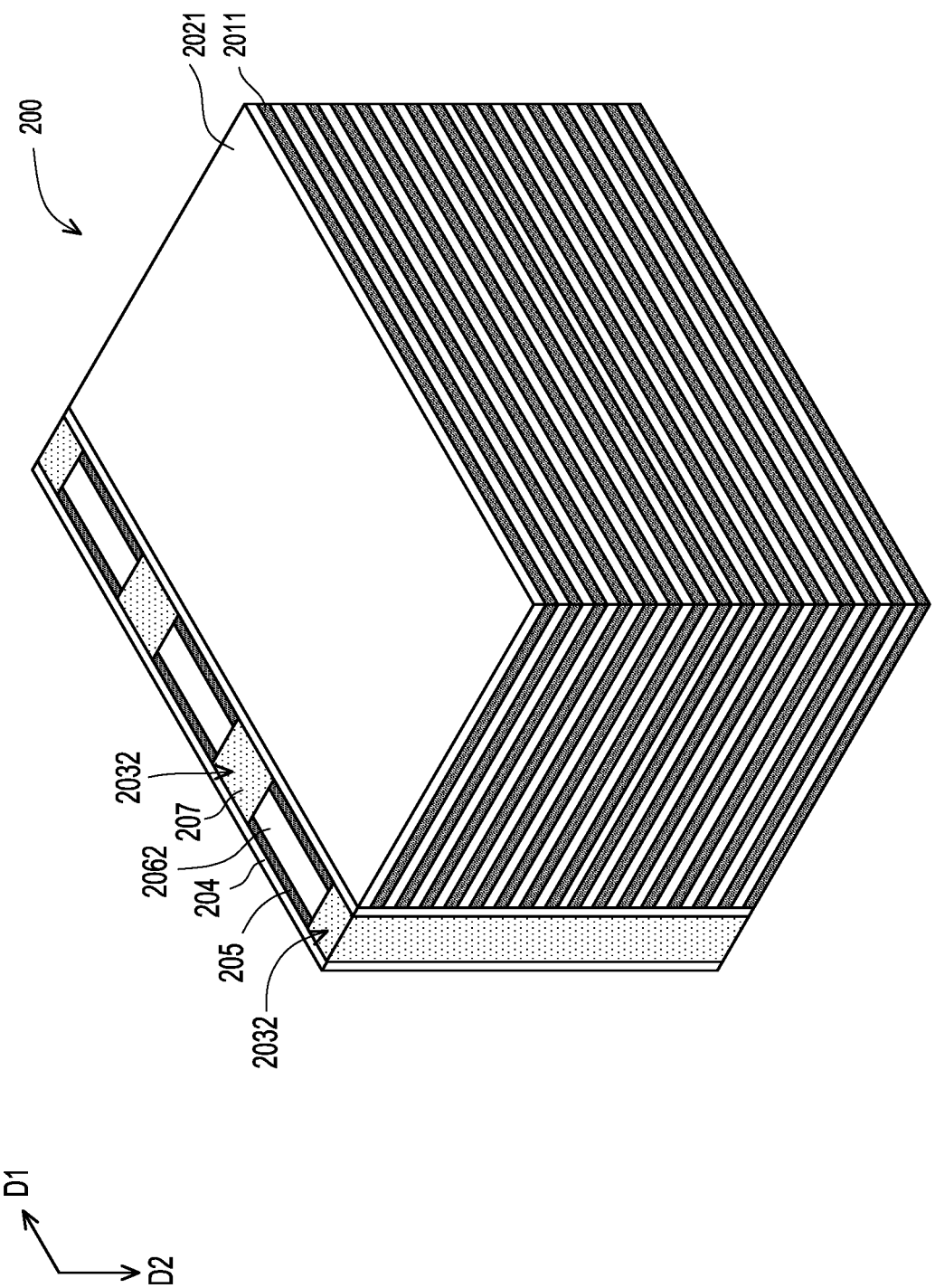

Referring to FIG. 5 and with reference to FIG. 4, a plurality of isolation pillars 207 may be formed in the trench 2031 and may extend along the second direction D2 and be separately arranged side by side along the first direction D1. For example, a portion of the channel material layer 2051 and a portion of the dielectric material layer 2061 may be removed to form openings 2032 for the isolation pillars 207 formed therein, and channel layer(s) 205 and dielectric strips 2062 are respectively formed. The channel layer 205 is discontinuously arranged on opposing sidewalls of the data storage layer 204 and is spaced apart by the openings 2032. The dielectric strips 2062 are interposed between the channel layer 205 formed on the opposing sidewalls of the data storage layer 204 and also spaced apart by the openings 2032. The openings 2032 may be formed using lithography and etching techniques or other acceptable method(s). Once the openings 2032 are formed, one or more isolation material(s) may be formed in the openings 2032 by an acceptable process such as ALD, CVD, or the like. Acceptable isolation materials include oxides (e.g., silicon oxide), nitrides (e.g., silicon nitride), carbides (e.g., silicon carbide), a combination thereof, and/or the like. The planarization process is optionally performed to remove excess isolation material(s) over the topmost layer. Thereafter, the remaining isolation material(s) form the isolation pillars 207 in the openings 2032.

Figure 6:
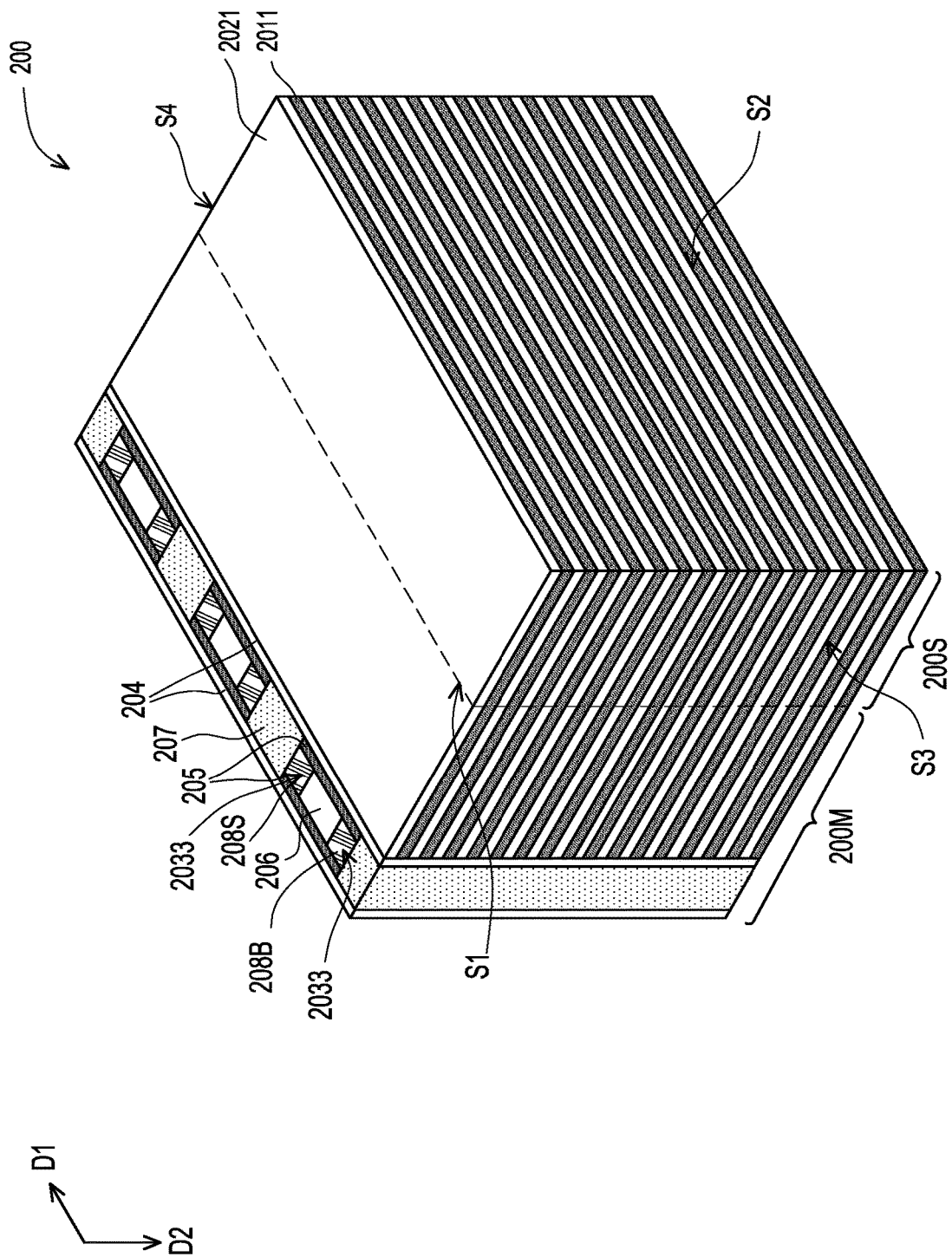

Referring to FIG. 6 and with reference to FIG. 5, a portion of each dielectric strips 2062 may be removed to form dielectric pillars 206, wherein openings 2033 may expose the corresponding isolation pillar 207 and two separate regions of the respective dielectric pillar 206 beside the isolation pillar 207. The removal of the portion of each dielectric strip 2062 to form the openings 2033 may be performed by lithography and etching techniques or other acceptable method(s). For example, the removal process may use acceptable etchant that etches the dielectric strips 2062 without significantly etching the isolation pillars 207. Subsequently, the openings 2033 may be filled with a conductive material to form pairs of conductive pillars (208B and 208S). The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, the planarization process may be performed to remove excess portions of the conductive material, thereby forming the conductive pillars (208B and 208S). For example, a pair of the conductive pillars 208 located at opposing sides of the respective dielectric pillar 206 may be referred to as a source line 208S and a bit line 208B of the memory cell. Up to here, the fabrication of the memory array region 200M of the memory device 200 is substantially complete.

Next, the staircase-shaped region 200S of the memory device 200 having the staircase structure formed at the three sides is fabricated as described below in accompanying with FIGS. 7A-11B. In some embodiments, the staircase-shaped region 200S includes four sides, where the first side S1 is connected to the memory array region 200M, and the staircase structures will be formed at the other sides (S2, S3, and/or S4). FIGS. 7A-10B shows forming a staircase structure at the second side S2 that is opposite to the first side S1. FIGS. 11A-11B show the staircase structures formed at the third and fourth sides S3 and S4, although this step is optional depending on circuit design. Note that the areas at the third and fourth sides S3 and S4 for forming the staircase structures are not illustrated in FIGS. 7A-10B for ease of descriptions.

It should be understood that although FIGS. 2-12B are described as a series of acts, these acts are not limiting in that the order of the acts can be altered in other embodiments. In some embodiments, the staircase structure of the staircase-shaped region is fabricated before forming the memory array region as will be described later in accompanying with FIG. 16B. As mentioned in the preceding paragraphs, the staircase structure has a zigzag configuration (e.g., including at least one turn) for providing a compact layout of contact vias, and a series of patterning processes may be performed in order to build up the staircase structure on the alternating stack. It should be understood that the number of the steps of the staircase in the embodiments below is merely an example, and the following embodiments may be employed to form various staircase structures having meandering steps with any number.

Figure 7A:
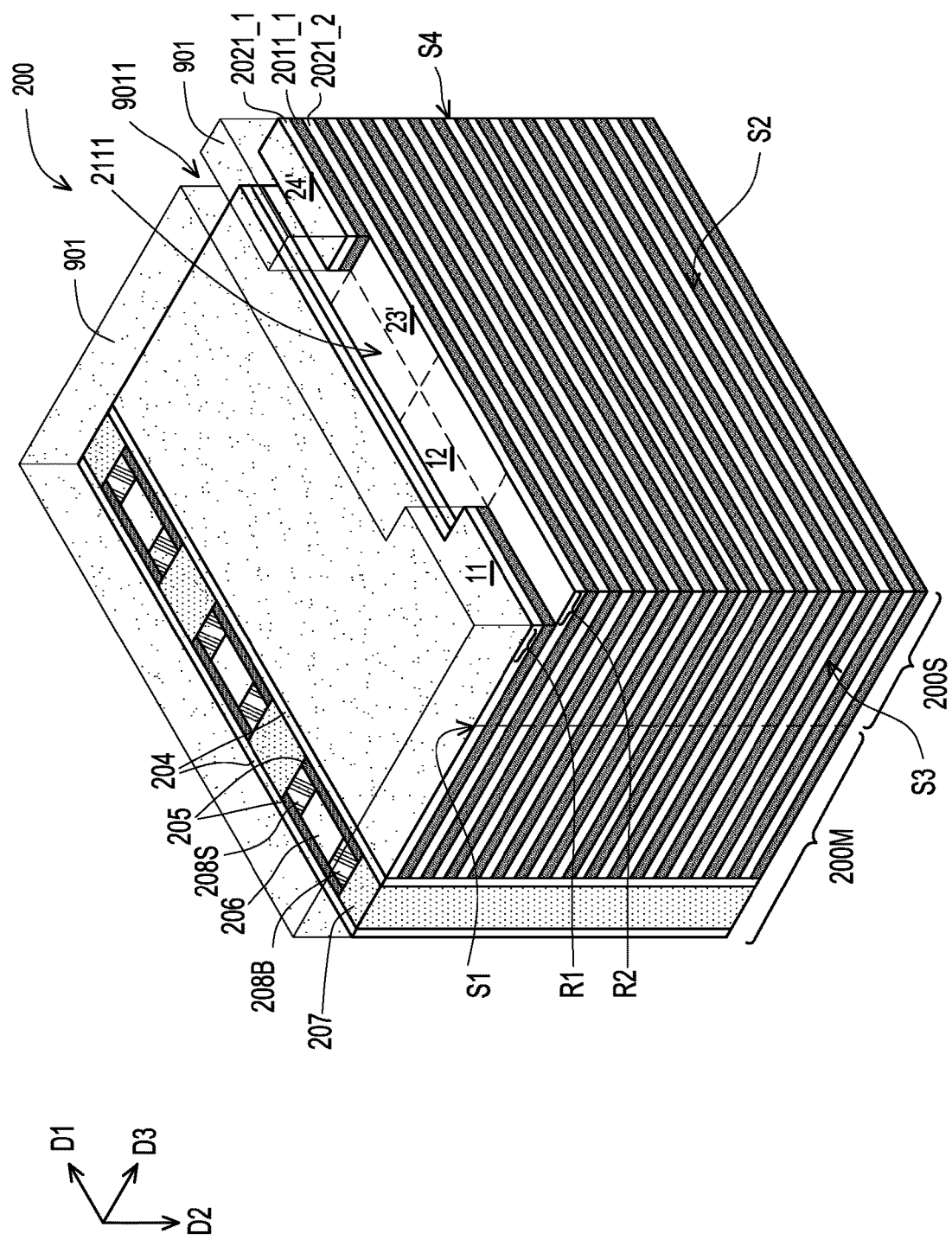
Figure 7B:
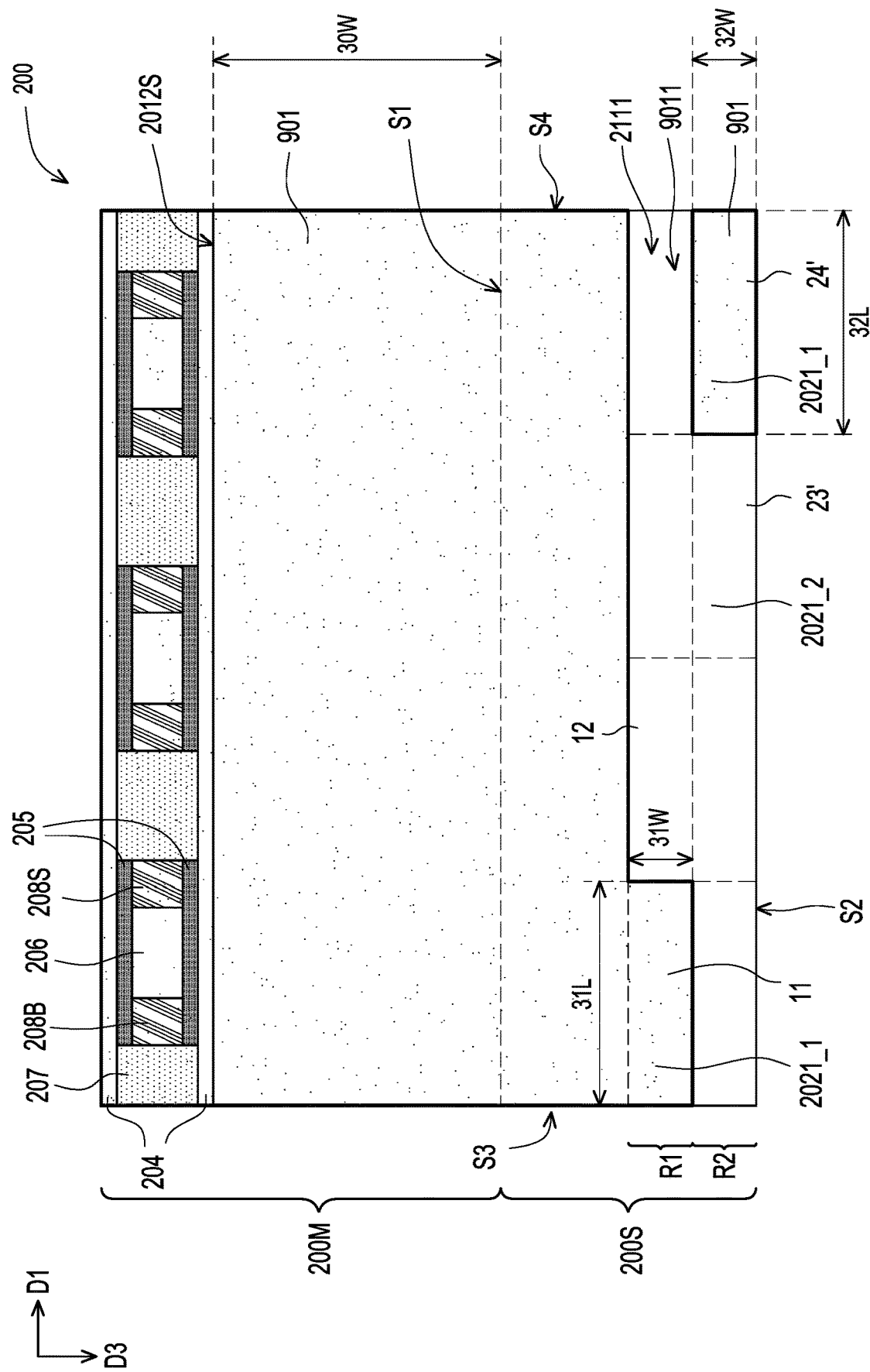
FIGS. 7B, 8B, 9B, 10B, 11B, and 12B illustrate schematic top views of corresponding structures shown in FIGS. 7A, 8A, 9A, 10A, 11A, and 12A, in accordance with some embodiments.

Referring to FIGS. 7A-7B, a first patterning process may be performed on the multi-layered stack in the staircase-shaped region 200S at the second side S2 to form a first pattern 2111. For example, a first mask layer 901 is formed over the memory array region 200M and the staircase-shaped region 200S. The first mask layer 901 may have a first opening pattern 9011 on the staircase-shaped region 200S to partially reveal the multi-layered stack, while the memory array region 200M is fully covered by the first mask layer 901 for protection. The staircase-shaped region 200S may be divided into several rows (e.g., R1, and R2) extending along the word line direction (e.g., the first direction D1), as can be seen in the top-down view of FIG. 7B. It is noted that although a first row R1 and a second row R2 are illustrated, the staircase-shaped region may be divided into more than two rows. The first row R1 and the second row R2 may be disposed side-by-side and arranged in the third direction D3, where the second row R2 is distal from the memory array region 200M, and the first row R1 is interposed between the memory array region 200M and the second row R2. The patterning processes will be performed on a portion of the multi-layered stack corresponding to the first row R1 and the second row R2 so as to form the staircase structure, while the layers in the memory array region 200M remain covered during the patterning processes.

With reference to FIG. 7B, the width 30W (or called the spacing) of the area measured between the sidewall 2012S of the multi-layered stack and the outer sidewall of the first row R1 may be in a range from about 100 nm to about 5 μm. Although other value may be employed depending on product requirements. Each of the first row R1 and the second row R2 may be divided into multiple segments, where each segment will act as a step after the staircase is formed. The steps in the first row R1 may be adjoined and substantially aligned with the steps in the second row R2, and the descending directions of the first row R1 of stairs and the second row R2 of stairs may be opposite to each other. For example, the first row R1 will be formed as a 4-step-down staircase, and the second row R2 will be formed as a 4-step-up staircase from the third side S3 to the fourth side S4. Note that four segments are shown for illustrative purposes only, the number of the segments construes no limitation in the disclosure.

In some embodiments, a respective word line in the memory array region 200M may be wider than the first row R1 and/or the second row R2. Alternatively, a respective word line in the memory array region 200M and the first row R1 and/or the second row R2 may have a substantially same width. For example, the width 31W of the first row R1, also viewed as the width of a respective step in the first row R1, is in a range from about 20 nm to about 1 μm. The length 31L of the of the first row R1, also viewed as the length of each step in the first row R1, is in a range from about 60 nm to about 3 μm. The dimension (e.g., the width 32W and the length 32L) of the second row R2 may be substantially the same as that of the first row R1, within process variations.

Still referring to FIGS. 7A-7B, the first segment 11 arranged in the first row R1 and disposed at the third side S3 and the fourth segment 24' arranged in the second row R2 and disposed at the fourth side S4 are covered by the first mask layer 901, while the rest of segments may be accessibly exposed by the first opening pattern 9011. Note that a series of consecutive natural numbers in the first row R1 and the second row R2 is consecutively numbered from the third side S3 to the fourth side S4. The first mask layer 901 may be a single layer or may include multiple sublayers. For example, the first mask layer 901 includes a photoresist sublayer and a hard mask sublayer underlying the photoresist sublayer. In some embodiments, the hard mask material and the photoresist material are sequentially formed over the memory array region 200M and the staircase-shaped region 200S. The photoresist material may be patterned to form the photoresist sublayer with an opening pattern by an acceptable lithography technique or other suitable methods. The opening pattern of the photoresist sublayer may be then transferred to the hard mask material to form the hard mask sublayer by using an etching process or other suitable removal methods. Alternatively, the hard mask sublayer is omitted.

Subsequently, the segments accessibly exposed by the first opening pattern 9011 may be removed by an acceptable etching process, such as by a dry etch, a wet etch, the like, or a combination thereof. For example, the portion of the topmost conductive material layer 2021_1 and the corresponding portion of the underlying dielectric material layer 2011_1 are etched to accessibly expose the top surface (or called the stepped surface) of the second level of the conductive material layers 2021_2. Thus, the first pattern 2111 is formed. Thereafter, the first mask layer 901 may be removed from the multi-layered stack by, e.g., ashing, stripping, or any suitable process. The first step 11 and the second step 12 in the first row R1 are thus formed, and the fourth step 24' and the third step 23' in the second row R2 are pre-formed.

Figure 8A:
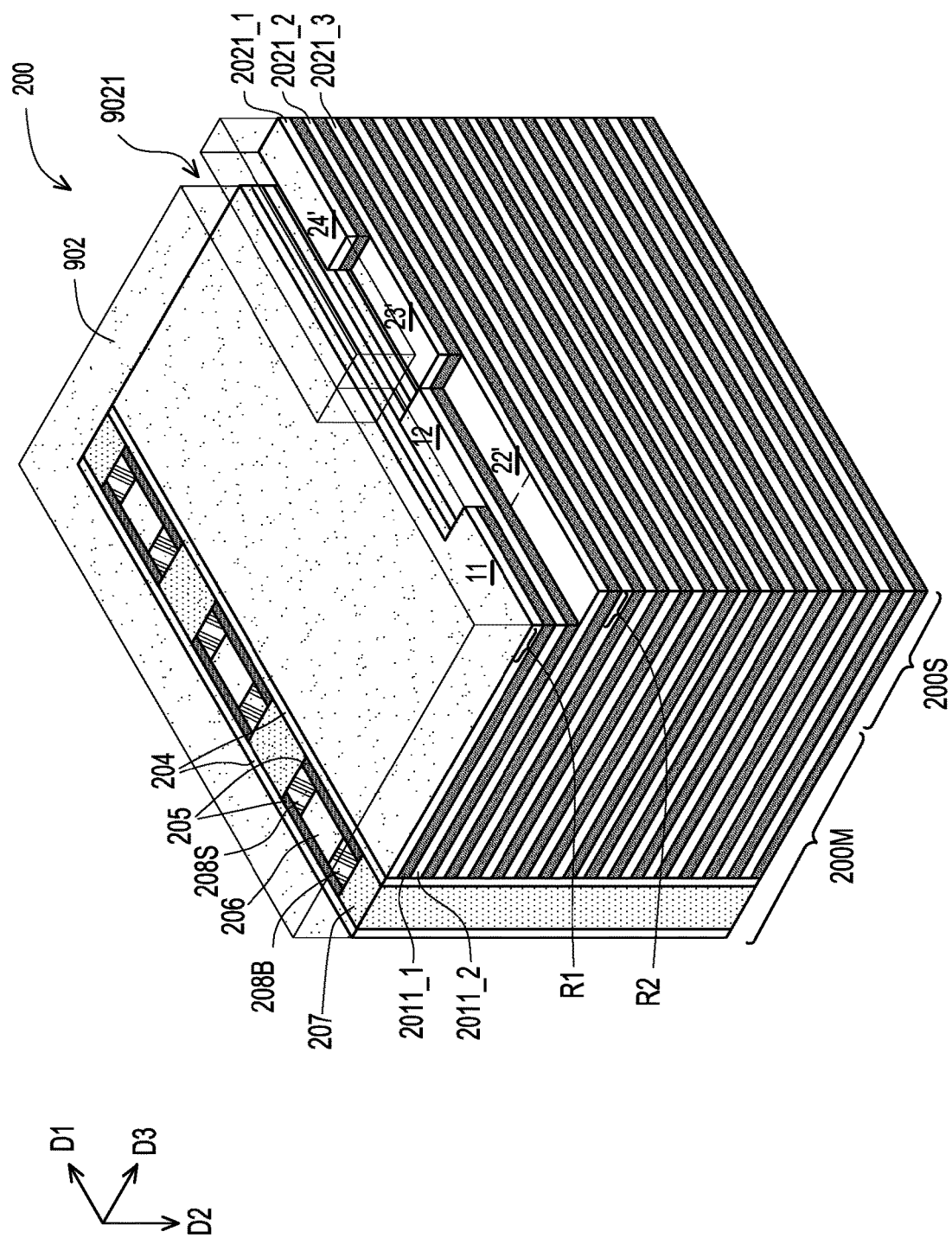
Figure 8B:
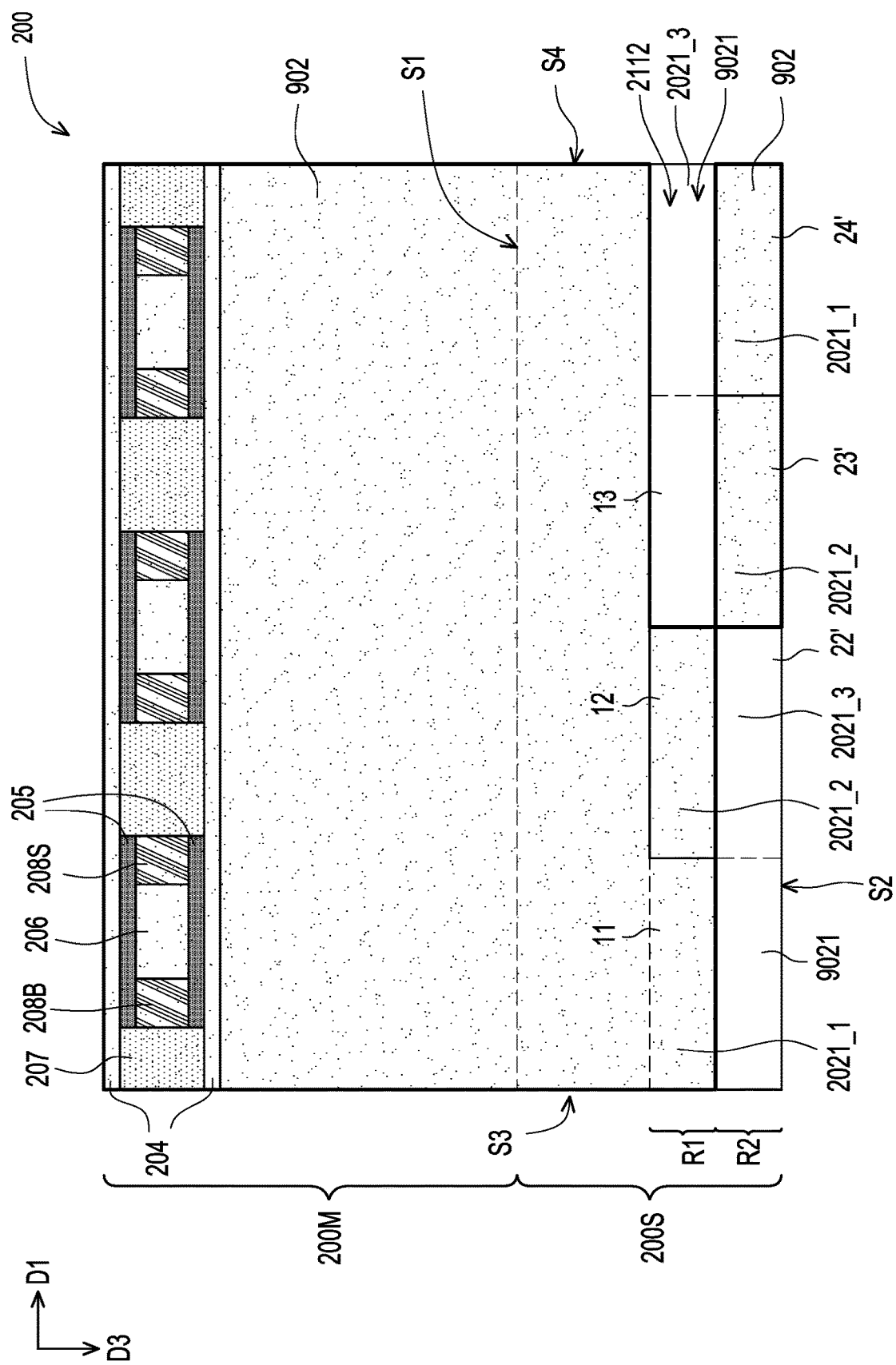

Referring to FIGS. 8A-8B, a second patterning process may be performed on the multi-layered stack in the staircase-shaped region 200S to form a second pattern 2112. For example, a second mask layer 902 having a second opening pattern 9021 is formed over the memory array region 200M and the staircase-shaped region 200S. The material(s) and the forming process of the second mask layer 902 may be similar to those of the first mask layer 901, except for the pattern design. For example, the second opening pattern 9021 accessibly reveals the third segment and the fourth segment in the first row R1 and also reveals the first segment and the second segment in the second row R2. The rest segments in the first row R1 and the second row R2 and the memory array region 200M may be covered by the second mask layer 902.

Next, the exposed segments in the first row R1 and the second row R2 may be removed by etching or any suitable process. For example, the portion of the second level of the conductive material layers 2021_2 and the corresponding portion of the underlying dielectric material layer 2011_2 are etched to accessibly expose the top surface (or called the stepped surface) of the third level of the conductive material layers 2021_3, thereby forming the second pattern 2112. The second mask layer 902 may be subsequently removed from the multi-layered stack by, e.g., an ashing, stripping, or any suitable process. The third step 13 in the first row R1 is thus formed, and the second step 22' in the second row R2 is pre-formed.

Figure 9A:
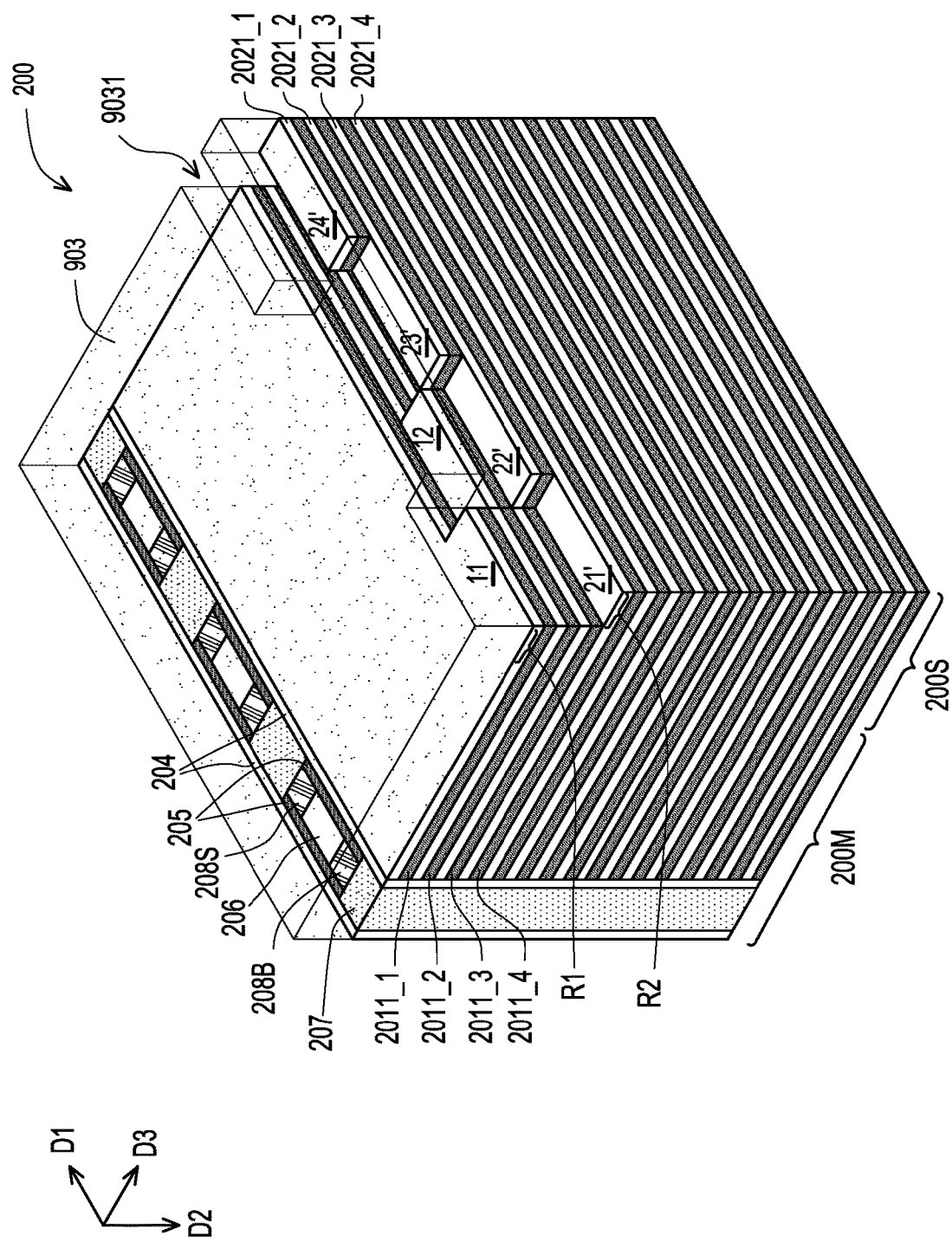
Figure 9B:
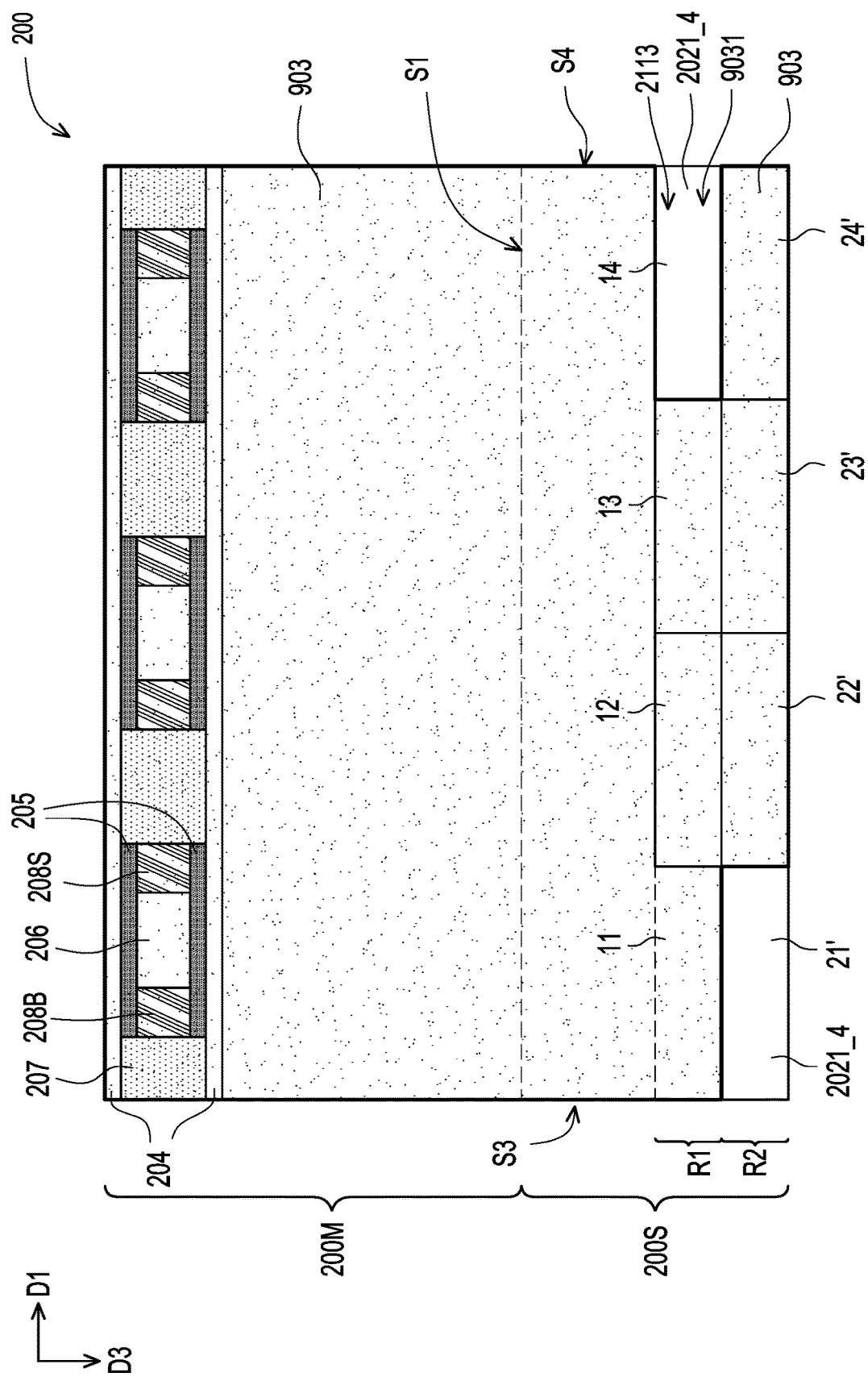

Referring to FIGS. 9A-9B, a third patterning process may be performed on the multi-layered stack in the staircase-shaped region 200S to form a third pattern 2113. For example, a third mask layer 903 having a third opening pattern 9031 is formed over the memory array region 200M and the staircase-shaped region 200S. The material(s) and the forming process of the third mask layer 903 may be similar to those of the first mask layer 901, except for the pattern design. For example, the third opening pattern 9031 accessibly reveals the fourth segment in the first row R1 and the first segment in the second row R2. The rest segments in the first row R1 and the second row R2 and the memory array region 200M may be covered by the third mask layer 903. The exposed segments are then removed by etching or any suitable method. For example, the portion of the third level of the conductive material layers 2021_3 and the corresponding portion of the underlying dielectric material layer 2011_3 are etched to accessibly expose the top surface (or called the stepped surface) of the fourth level of the conductive material layers 2021_4, thereby forming the third pattern 2113. Subsequently, the third mask layer 903 may be removed from the multi-layered stack. The fourth step 14 in the first row R1 is thus formed, and the first step 21' in the second row R2 is pre-formed.

Figure 10A:
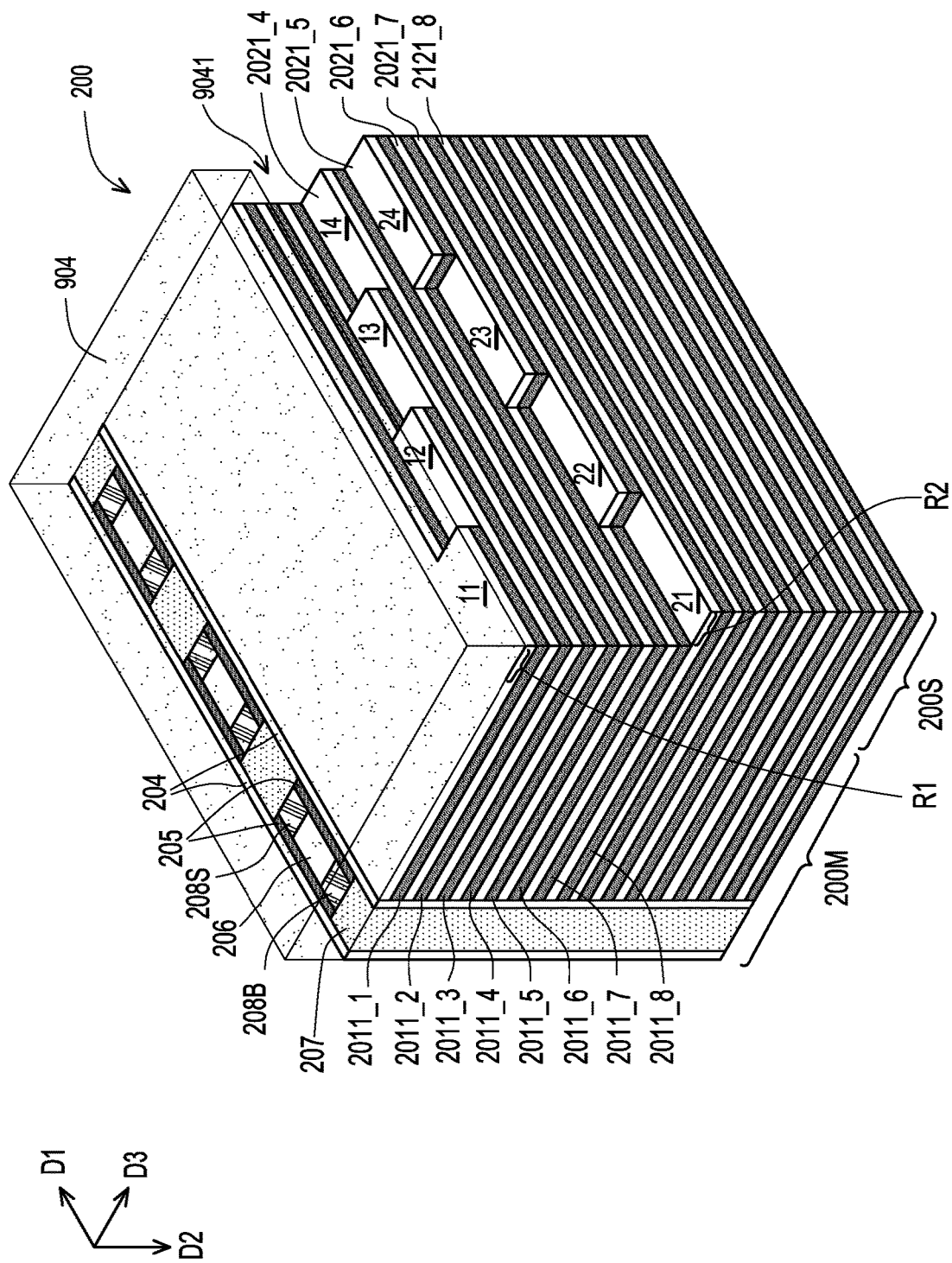
Figure 10B:
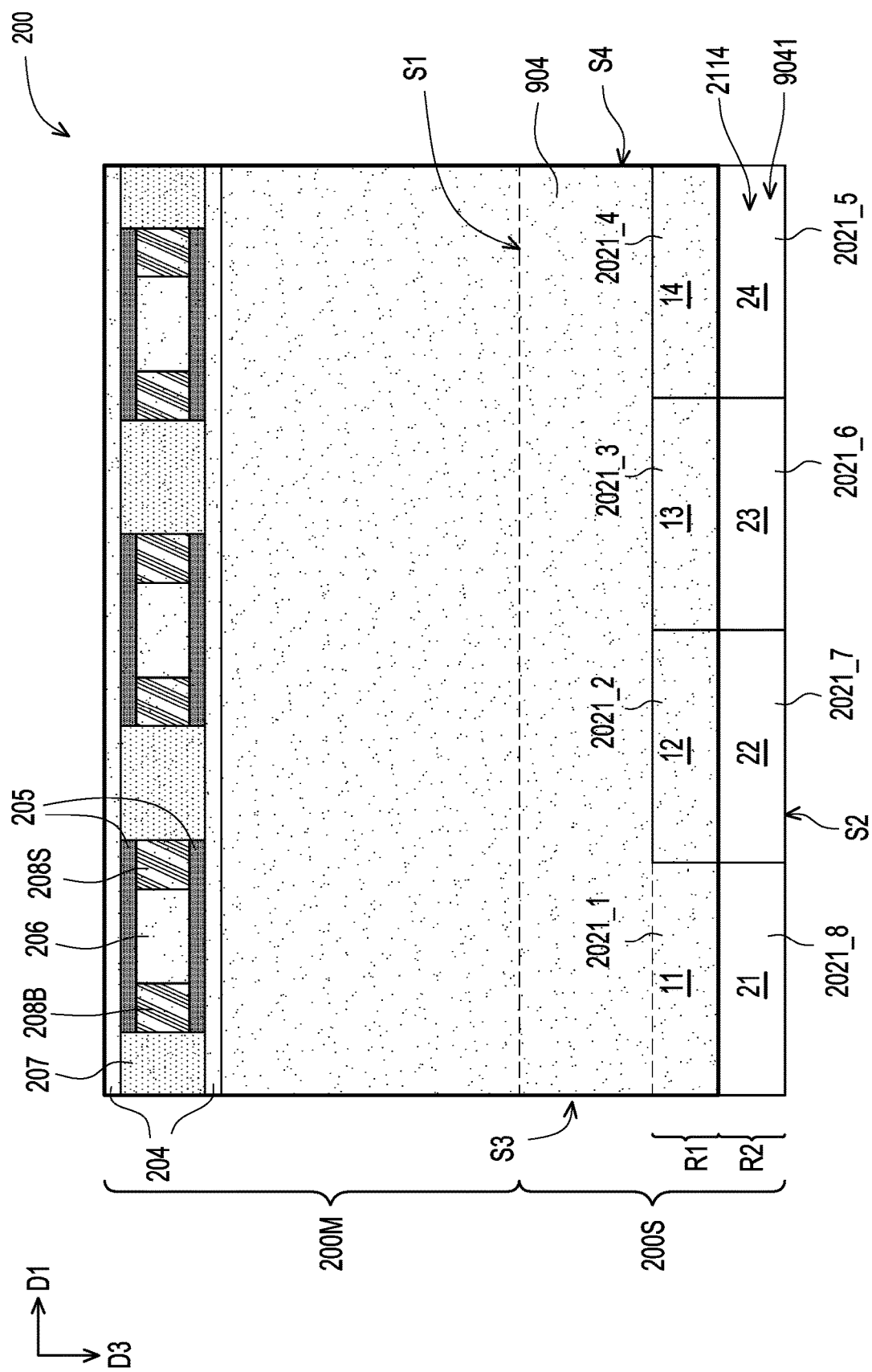
Figure 11A:
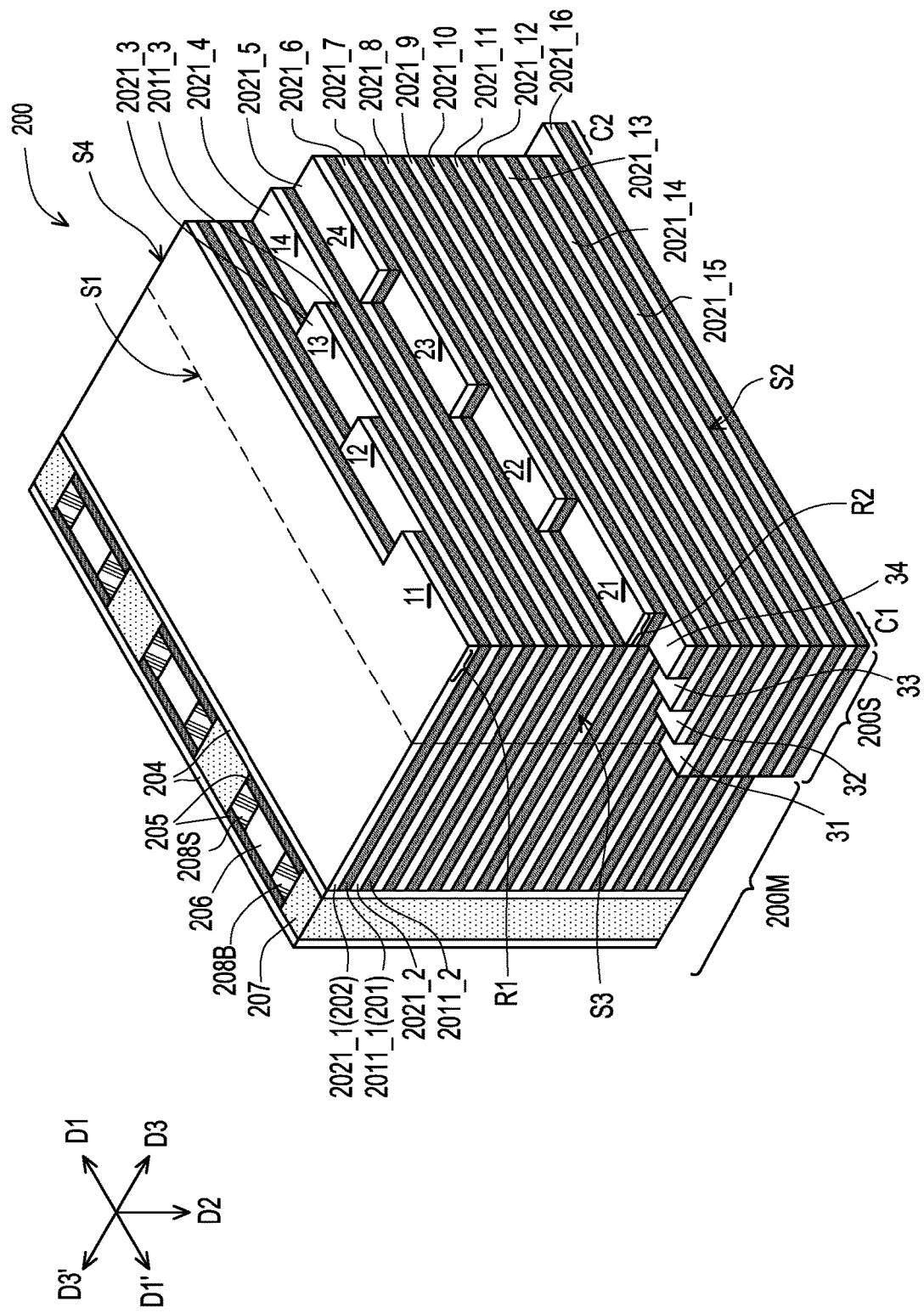
Figure 11B:
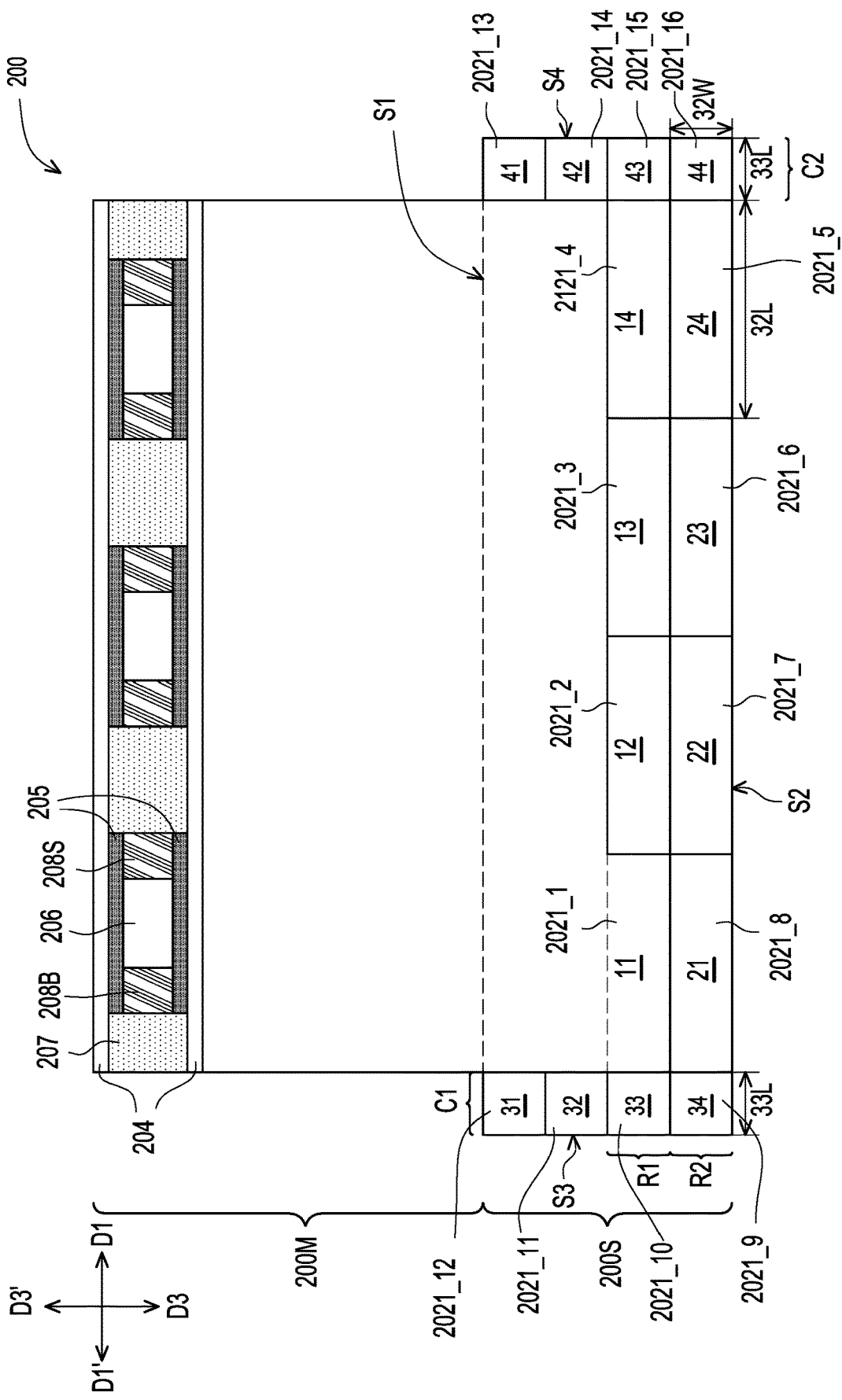

Referring to FIGS. 10A-10B, a fourth patterning process may be performed on the multi-layered stack in the staircase-shaped region 200S to form a fourth pattern 2114. For example, a fourth mask layer 904 having a fourth opening pattern 9041 is formed over the memory array region 200M and the staircase-shaped region 200S. The material(s) and the forming process of the fourth mask layer 904 may be similar to those of the first mask layer 901, except for the pattern design. For example, the fourth opening pattern 9041 accessibly reveals all of the segments in the second row R2. All of the segments in the first row R1 and the memory array region 200M may be covered by the fourth mask layer 904. The exposed segments in the second row R2 are then removed by etching to form the fourth pattern 2114. In some embodiments, the 4-step-down staircase in the second row R2 is basically formed after the third patterning process, while during the fourth patterning process, the staircase structure in the second row R2 is etched deeper than the staircase structure in the first row R1. Note that additional patterning process may be performed before the fourth patterning process to form a row of the stairs with more than four steps.

In some embodiments, at least eight layers of the conductive material layers and the dielectric material layers that are exposed by the fourth mask layer 904 are etched such that the fourth step 24 in the second row R2 becomes lower than the fourth step 14 in the first row R1 adjoining the fourth step 24 in the second row R2. The fourth mask layer 904 is then removed from the multi-layered stack after the etching. As shown in FIGS. 10A-10B, in the second row R2, the top surfaces of the conductive material layers (e.g., the eighth level 2021_8, the seventh level 2021_7, the sixth level 2021_6, the fifth level 2021_5) are respectively exposed and form the stepped surfaces of the first step 21, the second step 22, the third step 23, and the fourth step 24.

Referring to FIGS. 11A-11B, a series of patterning processes are optionally performed on the staircase-shaped region 200S of the multi-layered stack to form staircase structures at the third and fourth sides S3 and S4. The method of forming the staircase structures at the third and fourth sides S3 and S4 may be similar to the method illustrated in FIGS. 7A-10B, which requires four masking to form eight steps of two columns of stairs descending along the opposing directions (e.g., D3 and D3'). In the top plan view, the first column C1 and the second column C2 of the staircase structure are arranged along the third direction D3 and may be substantially perpendicular to the extending direction (e.g., D1) of the word lines. The first column C1 and the second column C2 of the staircase structures are respectively formed at the opposing sides (S3 and S4) and the first and second rows R1 and R2 are interposed between the first and the second columns C1 and C2 that include the steps descending along the opposing directions (e.g., D1 and D1').

In some embodiments, the staircase structure formed at the third side S3 is a 4-step-up staircase, and the staircase structure at the fourth side S4 is a 4-step-down staircase, in the third direction D3 from the first side S1 to the second side S2. The first column C1 of stairs including the first step 31, the second step 32, the third step 33, and the fourth step 34 may gradually step upward along the third direction D3, while the second column C2 of stairs including the first step 41, the second step 42, the third step 43, and the fourth step 44 gradually step downward along the third direction D3. Note that a series of consecutive natural numbers in the first column C1 and the second column C2 is consecutively numbered from the first side S1 to the second side S2. Again, the number of the steps of the staircase is merely an example and construes no limitation in the disclosure.

With continued reference to FIGS. 11A-11B, the top surfaces of the conductive material layers (e.g., the twelfth level 2021_12, the eleventh level 2021_11, the tenth level 2021_10, the ninth level 2021_9) are respectively exposed and form the stepped surfaces of the first step 31, the second step 32, the third step 33, and the fourth step 34 in the first column C1. Similarly, the top surfaces of the conductive material layers (e.g., the thirteenth level 2021_13, the fourteenth level 2021_14, the fifteenth level 2021_15, the sixteenth level 2021_16) are respectively exposed and form the stepped surfaces of the first step 41, the second step 42, the third step 43, and the fourth step 44 in the second column C2. Each step in the first column C1 and/or the second column C2 may have the width substantially equal to the width 32W of the respective step in the first row R1 and/or the second row R2. In some embodiments, the length 33L of each step in the first column C1 and/or the second column C2 is less than the length 32L of the respective step in the first row R1 and/or the second row R2 for saving space. For example, the respective step in the first and second columns C1 and C2 includes the width 32W and the length 33L that are substantially equal. That is, the stepped surface of the respective step in the first and second columns C1 and C2 is of a square shape in the top plan view, while the stepped surface of the respective step in the first and second rows R1 and R2 is of a rectangular shape in the top plan view. Although other top-view shapes may be employed, depending on product and process requirements At this stage, the fabrication of staircase structure is substantially complete. The conductive material layers at each level may be collectively viewed as word lines 202 of the memory device 200. The fourth step 34 in the first column C1 is immediately adjacent to the first step 21 in the second row R2, and the fourth step 44 in the second column C2 is immediately adjacent to the fourth step 24 in the second row R2. The steps of the staircase structure in the staircase-shaped region 200S may step downward from the first step 11 to the fourth step 14 in the first row R1 along the first direction D1, make a U-turn to step downward from the fourth step 24 to the first step 21 in the second row R2 along the opposing direction D1', and then make a 90-degree change of direction (or an L-turn) to step downward from the fourth step 34 to the first step 31 in the first column C1 along the opposing direction D3', and make a 180-degree change of direction to step downward from the first step 41 to the fourth step 44 in the second column C2 along the third direction D3.

Figure 12A:
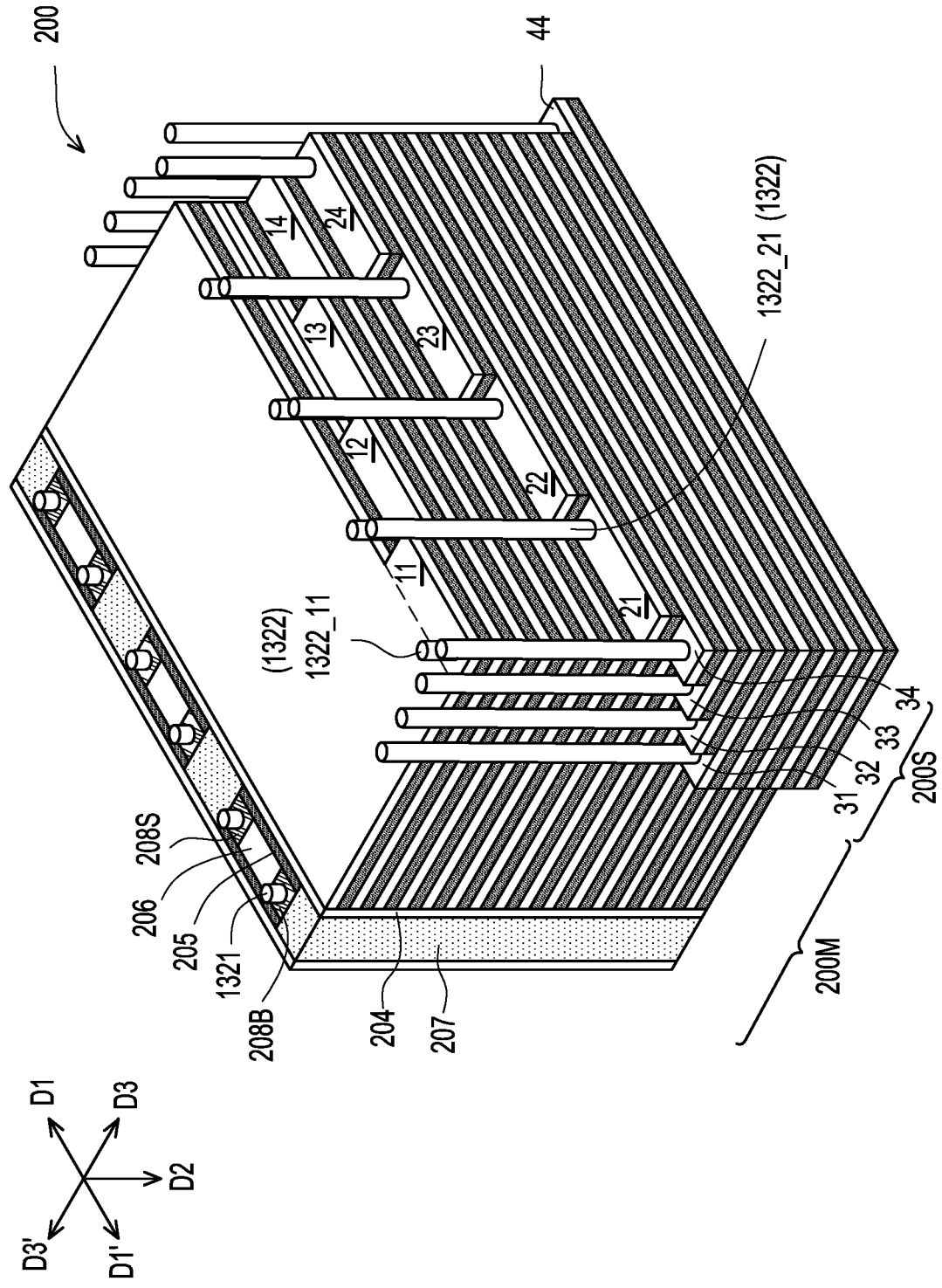
Figure 12B:
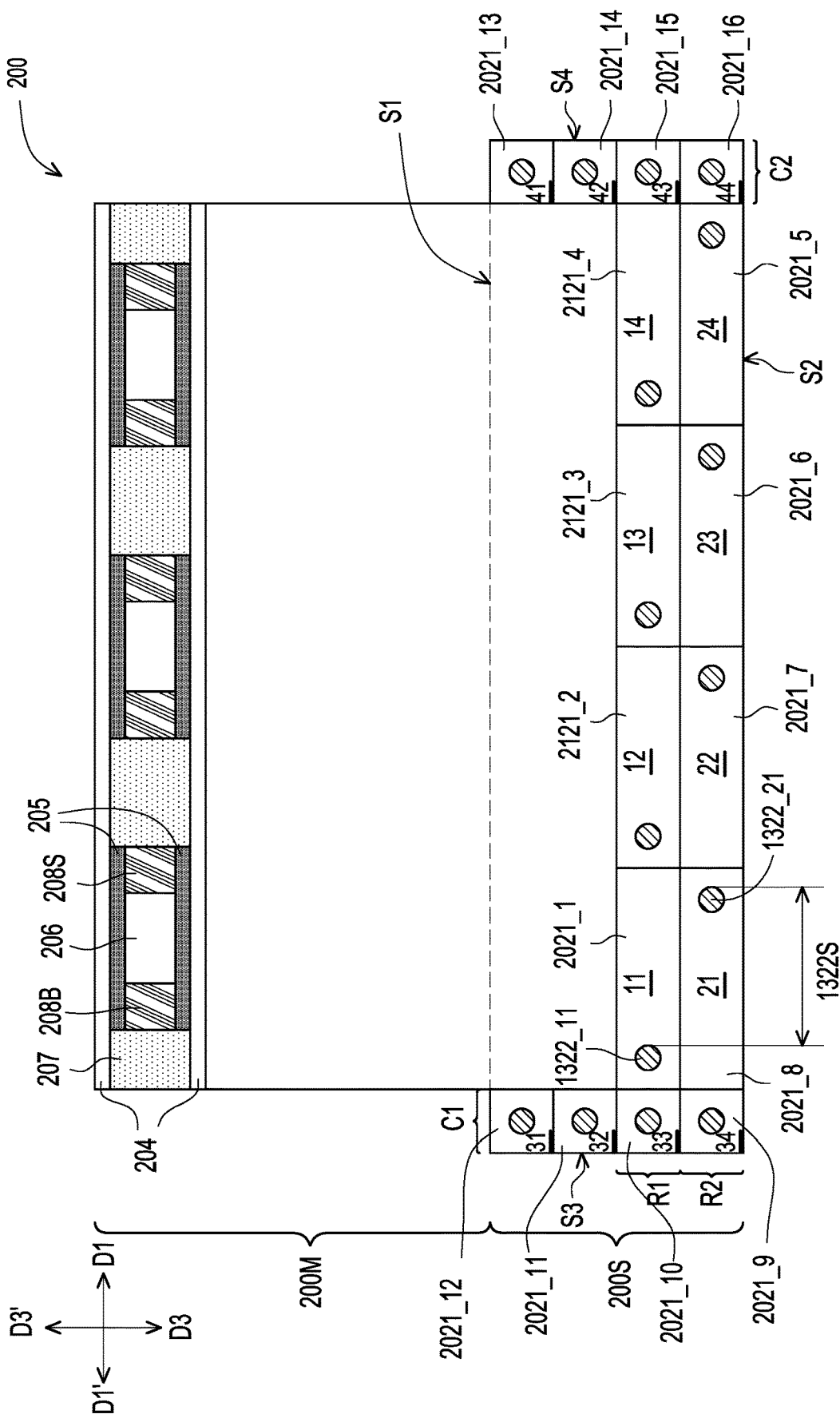

Referring to FIGS. 12A-12B, contact vias 1321 may be formed over the memory array region 200M and electrically coupled to the respective conductive pillar (208B and 208S), while contact vias 1322 may be formed over the staircase-shaped region 200S and electrically coupled to a respective conductive material layer 2021. The contact vias 1321 and 1322 may be formed during a same step. For example, the contact vias 1321 and 1322 are formed by forming openings in the dielectric layers (not shown; e.g., the dielectric layers 124 in FIG. 1) and filling the openings with an electrically conductive material. A planarization process is optionally performed, and thus the contact vias 1321 and 1322 may have substantially planar top surfaces. The contact vias 1321 and 1322 may be connected to, e.g., the underlying electrical components or circuits in the substrate 101, and/or the interconnect structure 120, through, e.g., the conductive features 122 (see FIG. 1).

The stepped terraces of conductive material layers 2021 allow easy access for the contact vias 1322. In some embodiments, the staircase structures of the first and second rows R1 and R2 are immediately adjacent and have a 180-degree change of direction, which makes the staircase structure in the first row R1 descending in the first direction D1 and the staircase structure in the second row R2 descending in the opposing direction D1', thereby creating a space advantage. The contact vias 1322 formed over a respective row (or a respective column) of stairs may be substantially aligned, within process variations. The contact vias 1322 formed over the first row R1 may be laterally offset from the contact vias 1322 formed over the second row R2, as seen from the top-down view of FIG. 12B. In some embodiments, the contact via 1322_11 at the first step 11 and the contact via 1322_21 at the first step 21 are laterally staggered by an offset 1322S, where the offset 1322 may be non-zero.

In some embodiments, the contact vias 1322 formed over a respective row (or a respective column) may have increasing (or decreasing) heights due to the staircase configuration. For example, the heights of the contact vias 1322 formed over the first column C1 gradually decrease in the third direction D3, while the heights of the contact vias 1322 formed over the second column C2 may gradually increase in the third direction D3. Similarly, the heights of the contact vias 1322 formed over the first row R1 gradually increase in the first direction D1, while the heights of the contact vias 1322 formed over the second row R2 may gradually increase in the opposing direction Dr. The areas of the staircase structure in staircase-shaped region 200S may be more efficiently utilized compared to conventional layouts in which the staircase structure and the main row are arranged along only one direction.

Figure 13:
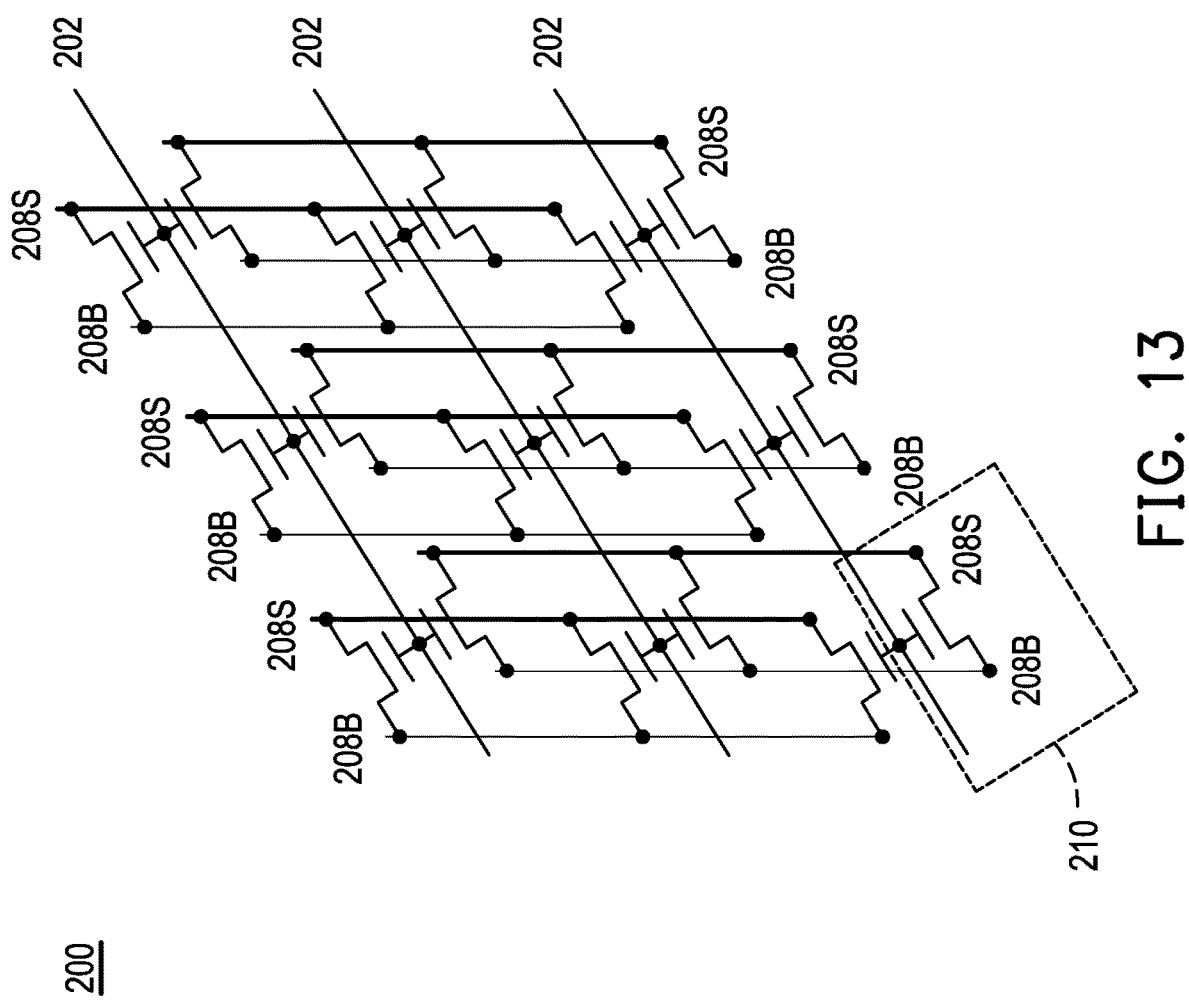
FIG. 13 illustrates an equivalent circuit diagram of a memory device, in accordance with some embodiments.

FIG. 13 illustrates an equivalent circuit diagram of a memory device, in accordance with some embodiments. The circuit diagram may correspond to a portion of the memory device 200 (or 200A, 200B shown in FIGS. 14A-15) disclosed herein. Referring to FIG. 13, the memory device 200 includes a plurality of memory cells 210 arranged in a grid of rows and columns. FIG. 13 illustrates three horizontally extending word lines 202 located at three vertical levels, which correspond to three different word lines of the memory device 200. For example, the gate electrodes of the transistors at a same vertical level are connected to a same word line. FIG. 13 illustrates vertically extending bit lines 208B and source lines 208S, where each of the bit lines 208B and source lines 208S is connected to a plurality of vertically stacked memory cells. The gate of the transistor is electrically connected to a respective word line 202, a source/drain regions of the transistor is electrically connected to a respective bit line 208B and a respective source line 208S, where the source lines 208S may be electrically connected to ground. For example, the memory cells 210 in a same row of the memory array share a common word line 202, while the memory cells 210 in a same column of the memory array share a common bit line 208B and a common source line 208S.

Figure 14A:
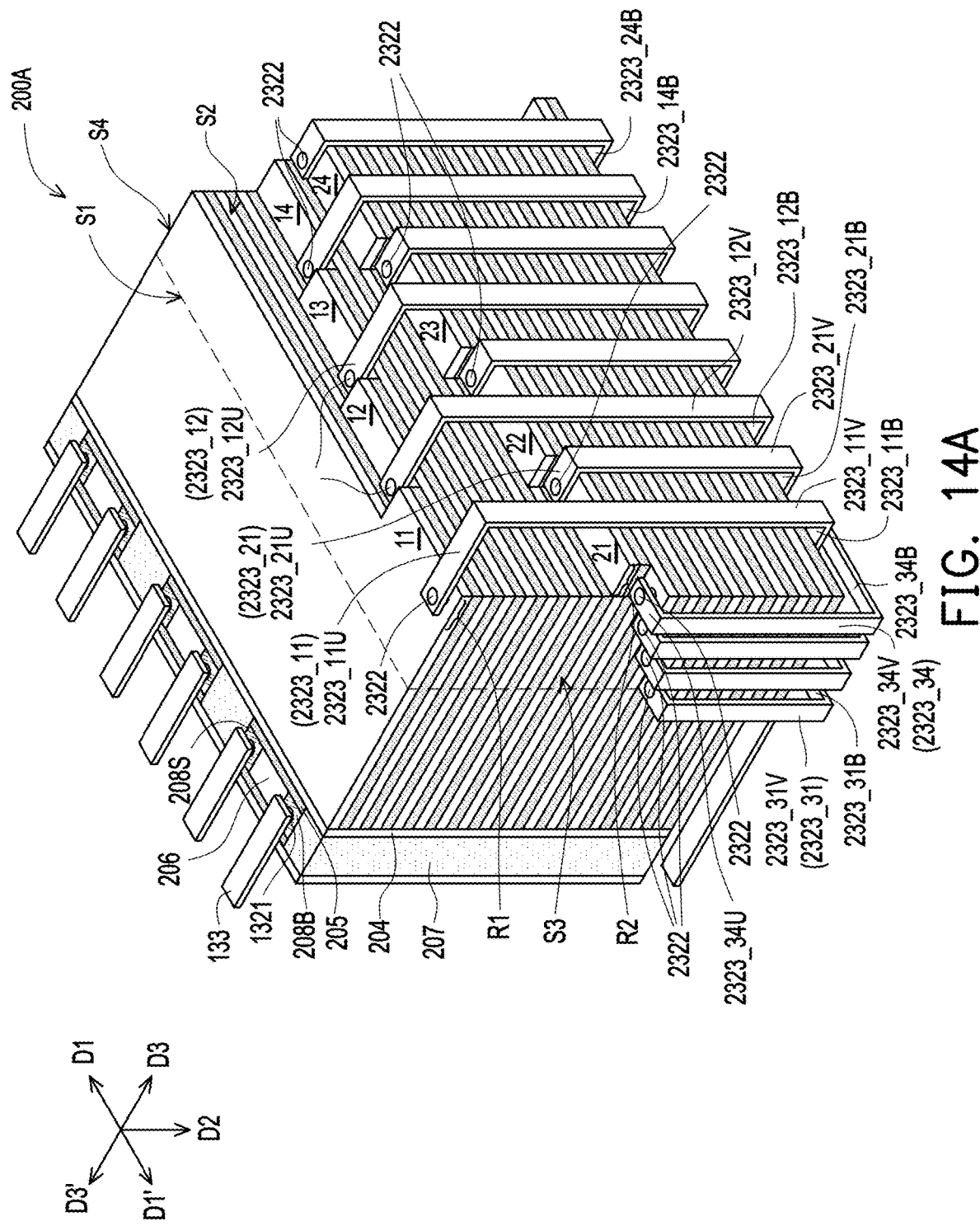
FIG. 14A illustrates a schematic perspective view of a memory device, in accordance with some embodiments.
Figure 14B:
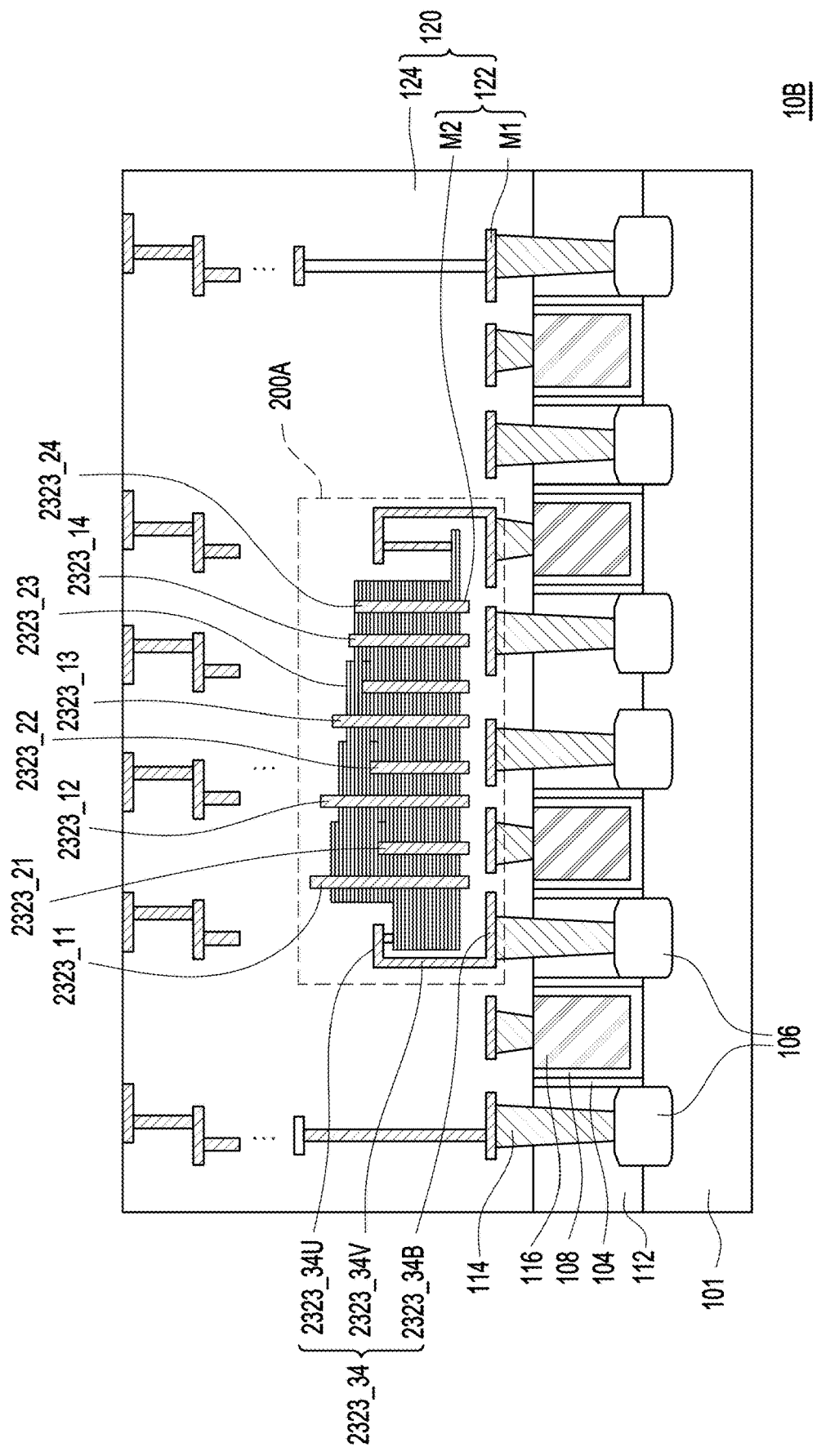
FIG. 14B illustrates a schematic cross-sectional view of a semiconductor structure with the memory device described in FIG. 14A, in accordance with some embodiments.

FIG. 14A illustrates a schematic perspective view of a memory device and FIG. 14B illustrates a schematic cross-sectional view of a semiconductor structure with the memory device described in FIG. 14A, in accordance with some embodiments. Unless specified otherwise, the materials and the formation methods of the elements in these embodiments are essentially the same as the like elements, which are denoted by like reference numerals in the embodiments shown in FIGS. 2-12B.

Referring to FIGS. 14A-14B and with reference to FIGS. 1 and 12A, the memory device 200A of the semiconductor structure 10B is similar to the memory device 200, except for the contact routing configuration. In some embodiments, the contact vias 2322 landing on a corresponding step in the staircase-shaped region 200S have a substantially same height, within process variations. The respective contact via 2322 may be connected to one of conductive lines 2323. For example, an upper portion 2323_11U of the conductive line 2323_11 is disposed on the contact via 2322 landing on the first step 11 in the first row R1, a lower portion 2323_11B of the conductive line 2323_11 is disposed below the bottom of the multi-layered stack, and a vertical portion 2323_11V of the conductive line 2323_11 is connected to the upper portion 2323_11U and the lower portion 2323_11B. The upper portion 2323_11U may be located at a same level as the conductive lines 133 connected to the contact vias 1321. For example, the lower portion of the conductive line may be formed before forming the alternating stack of dielectric materials and the conductive materials as shown in FIG. 2, and after the staircase structure is formed, the vertical portion and the upper portion of the conductive line are formed by using dual damascene process or other suitable technique.

In some embodiments, the upper portion 2323_21U of the conductive line 2323_21 is disposed on the contact via 2322 landing on the first step 21 in the second row R2, a lower portion 2323_21B of the conductive line 2323_21 is disposed below the bottom of the multi-layered stack and next to the lower portion 2323_11B, and a vertical portion 2323_21V of the conductive line 2323_21 is connected to the upper portion 2323_21U and the lower portion 2323_21B and is substantially parallel to the vertical portion 2323_11V. The upper portion 2323_12U of the conductive line 2323_12 is disposed on the contact via 2322 landing on the second step 12 in the first row R1 and is lower than the upper portion 2323_11U, a lower portion 2323_12B of the conductive line 2323_12 is disposed below the bottom of the multi-layered stack and next to the lower portion 2323_21B, and a vertical portion 2323_12V of the conductive line 2323_12 is connected to the upper portion 2323_12U and the lower portion 2323_12B and is substantially parallel to the vertical portions 2323_11V and 2323_21V.

In some embodiments, three consecutive vertical portions (e.g., 2323_11V, 2323_21V, and 2323_12V) arranged at the second side S2 have different lengths, where the vertical portion 2323_11V is longer than the vertical portion 2323_12V, and the vertical portion 2323_12V is longer than the vertical portion 2323_21V. The lower portions (2323_11B to 2323_14B) respectively connected to the contact vias 2322 landing on the steps in the first row R1 may be arranged at a same level (e.g., M2). In some embodiments, the lower portions (2323_21B to 2323_24B) respectively connected to the contact vias 2322 landing on the steps in the second row R2 may be arranged at the level same as the lower portions (2323_11B to 2323_14B).

The conductive line 2323_34 may include an upper portion 2323_34U connected to the contact via 2322 landing on the fourth step 34 in the first column C1, the lower portion 2323_34B disposed below the lower portion 2323_11B, and the vertical portion 2323_34V connected to the upper portion 2323_34U and the lower portion 2323_34B. The lengths of the vertical portions (2323_31V to 2323_34V) formed at the third side S3 may gradually increase. The lower portions (2323_31B to 2323_34B) may be arranged side by side at a same level (e.g., M1 which is lower than M2). For example, the lower portions (2323_31B to 2323_34B) are first formed over the substrate, the lower portions (2323_11B to 2323_14B and 2323_21B to 2323_24B) are then formed over the lower portions (2323_31B to 2323_34B). After the staircase structure is formed over the lower portions, the vertical portions and the upper portions of the conductive lines are formed by using dual damascene process or any suitable process. The conductive lines formed at the fourth side S4 may have similar configuration, where the lengths of the vertical portions may gradually decrease in the third direction D3. In some embodiments, the lower portions of the conductive lines formed at the fourth side S4 are arranged at the level same as the lower portions of the conductive lines formed at the third side S3. Although the conductive lines may have other configuration(s).

Figure 15:
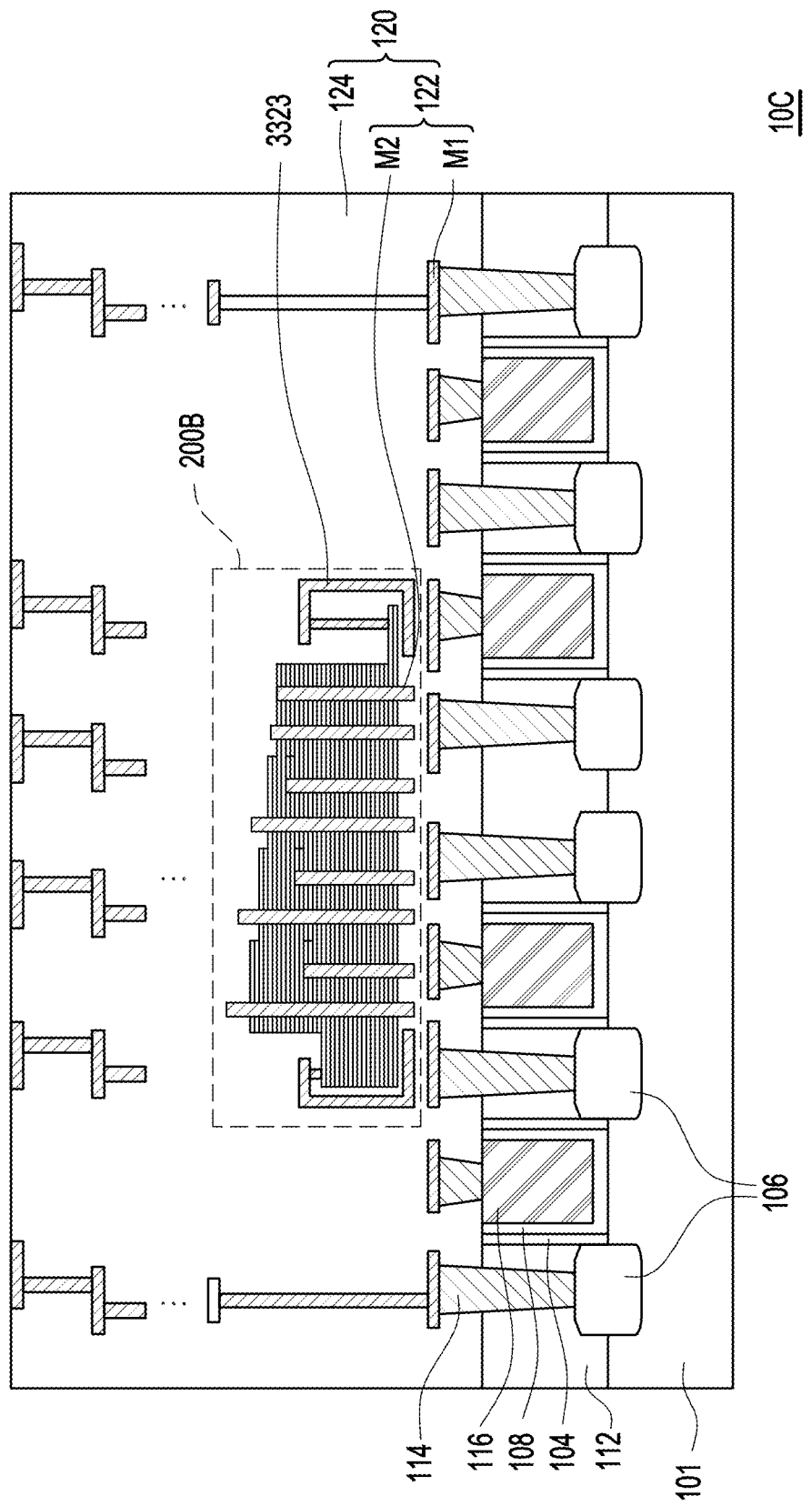
FIG. 15 illustrates a schematic cross-sectional view of a semiconductor structure including a memory device, in accordance with some embodiments.

FIG. 15 illustrates a schematic cross-sectional view of a semiconductor structure including a memory device, in accordance with some embodiments. Items of FIG. 15 that are the same items in FIGS. 1 and 14B are indicated by the same reference numerals, and the details thereof are not repeated for the sake of brevity. Referring to FIG. 15 and with reference to FIG. 14B, the memory device 200B of the semiconductor structure 10C is similar to the memory device 200A of the semiconductor structure 10B, except that the lower portions of all conductive lines 3323 are arranged at a same level (e.g., M2 or M1 in other embodiments).

Figure 16A:
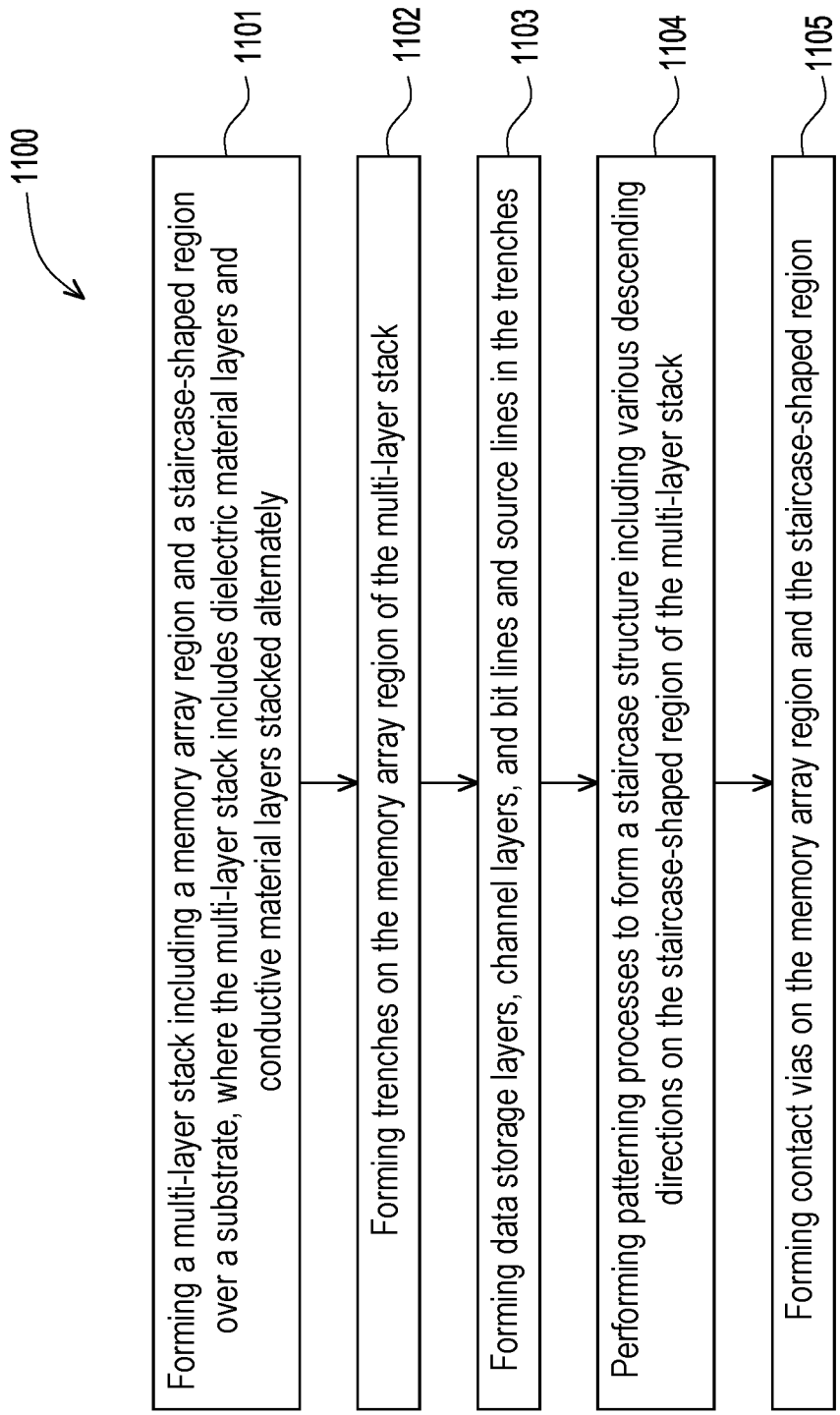
FIGS. 16A-16B illustrate flow charts of methods of forming a memory device, in accordance with some embodiments.
Figure 16B:
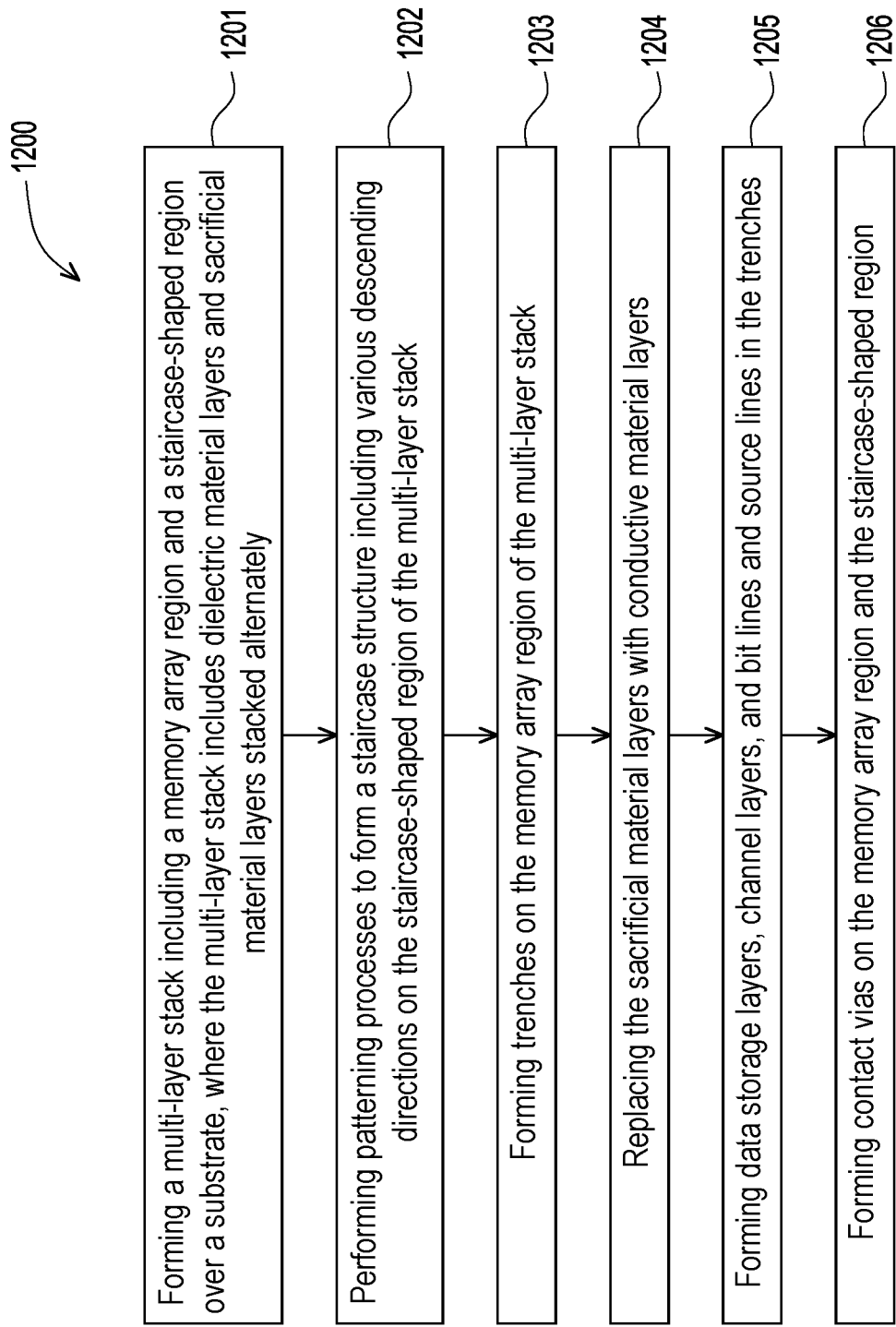

FIGS. 16A-16B illustrate flow charts of methods of forming a memory device, in accordance with some embodiments. It should be understood that the embodiment methods shown in FIGS. 16A-16B are merely examples of many possible embodiment methods. One of ordinary skill in the art would recognize many variations, alternatives, and modifications. For example, various steps as illustrated in FIGS. 16A-16B may be added, removed, replaced, rearranged, or repeated.

Referring to FIG. 16A, at the act 1101 of the method 1100, a multi-layered stack including a memory array region and a staircase-shaped region is formed over a substrate, where the multi-layered stack includes a plurality of dielectric material layers and a plurality of conductive material layers stacked alternately. FIG. 2 illustrates a perspective view corresponding to some embodiments of the act 1101. In some embodiments, the transistors may be formed in/on the substrate before the act 1101 as shown in FIG. 1. At the act 1102 of the method 1100, a plurality of trenches is formed on the memory array region of the multi-layered stack to penetrate therethrough. FIG. 3 illustrates a perspective view corresponding to some embodiments of the act 1102.

At the act 1103 of the method 1100, data storage layers, channel layers, and pairs of bit lines and source lines are sequentially formed in the trenches. FIGS. 4-6 illustrate varying views corresponding to some embodiments of the act 1103. At the act 1104 of the method 1100, a series of patterning processes is performed to form the staircase structure on the staircase-shaped region of the multi-layered stack, where the staircase structure includes various descending (or ascending) directions. FIGS. 7A-11B illustrate varying views corresponding to some embodiments of the act 1104. At the act 1105 of the method 1100, a portion of contact vias is formed to connect the bit/source line pillars on the memory array region, and the other portion of contact vias is formed on the stepped surfaces of the staircase structure (i.e. staircase word lines) on the staircase-shaped region. FIGS. 12A-12B illustrate varying views corresponding to some embodiments of the act 1105. It should be noted that after the act 1105, additional conductive lines and dielectric layers may be formed on the memory device to complete the interconnect structure as shown in FIG. 1.

Referring to FIG. 16B, the method 1200 may be similar to the method 1100 illustrated in FIG. 16A, except that the staircase structure may be formed before forming the memory array region. For example, at the act 1201 of the method 1200, a multi-layered stack including a memory array region and a staircase-shaped region is formed over a substrate, and the multi-layered stack includes a plurality of dielectric material layers and a plurality of sacrificial material layers stacked alternately. The transistors may be formed in/on the substrate before the act 1201. At the act 1202 of the method 1200, a series of patterning processes is performed to form the staircase structure that has various descending (or ascending) directions on the staircase-shaped region of the multi-layered stack. The patterning methods may be similar to the method described in FIGS. 7A-11B.

At the act 1203 of the method 1200, a plurality of trenches is formed on the memory array region of the multi-layered stack. At the act 1204 of the method 1200, the sacrificial material layers on the multi-layered stack may be replaced with conductive material layers, thereby forming the staircase word lines. At the act 1205 of the method 1200, data storage layers, channel layers, and pairs of bit lines and source lines are formed in the trenches. At the act 1206 of the method 1200, contact vias connected to the source/drain regions and word line regions are formed on the memory array region and the staircase-shaped region. It should be noted that additional conductive lines and dielectric layers may be formed on the memory device after the act 1206 to complete the interconnect structure as shown in FIG. 1.

According to some embodiments, a memory device includes an alternating stack of dielectric layers and word line layers, pairs of bit lines and source lines spaced apart from one another, a data storage layer covering a sidewall of the alternating stack, and channel layers interposed between the data storage layer and the pairs of bit lines and source lines. The alternating stack includes a staircase structure in a staircase-shaped region, and the staircase structure steps downward from a first direction and includes at least one turn. The pairs of bit lines and source lines extend in a second direction that is substantially perpendicular to the first direction and are in lateral contact with the data storage layer through the channel layers.

According to some alternative embodiments, a semiconductor structure includes an interconnect structure disposed over a substrate and a memory device embedded in the interconnect structure. The memory device includes an alternating stack of dielectric layers and word line layers extending in a word line direction, a data storage layer extending in a stacking direction of the alternating stack to cover the alternating stack, and bit lines and source lines spaced apart from one another and extending in the stacking direction of the alternating stack. The alternating stack includes a staircase structure, the staircase structure includes a first row of stairs and a second row of stairs that extend along the word line direction and are disposed side-by-side, and the first row and the second row step downward in opposing directions. The bit lines and the source lines contact the data storage layer through channel layers.

According to some alternative embodiments, a manufacturing method of a semiconductor structure includes at least the following steps. A memory device is formed in an interconnect structure over a substrate. Forming the memory device includes forming an alternating stack of dielectric material layers and conductive material layers, wherein the alternating stack comprises a memory array region and a staircase region adjoining the memory array region; forming a trench on the memory array region of the alternating stack; forming a data storage layer, channel layers, bit line pillars, and source line pillars in the trench; and performing patterning processes to from a staircase structure on the staircase region. The staircase structure steps downward from a first direction and makes a 180-degree turn to step downward in a second direction opposite to the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   an alternating stack of dielectric layers and word line layers comprising a staircase structure, and the staircase structure stepping downward from a first direction and comprising at least one turn;
   pairs of bit lines and source lines spaced apart from one another and extending in a second direction that is perpendicular to the first direction;
   a data storage layer covering a sidewall of the alternating stack; and
   channel layers interposed between the data storage layer and the pairs of bit lines and source lines, wherein the pairs of bit lines and source lines are in lateral contact with the data storage layer through the channel layers.

2. The memory device of claim 1, wherein the staircase structure comprises a first portion stepping downward from the first direction and a second portion stepping downward from a third direction opposite to the first direction.

3. The memory device of claim 2, wherein the staircase structure comprises a third portion stepping downward from a fourth direction that is perpendicular to the first direction and the third direction.

4. The memory device of claim 1, further comprising:
   contact vias landing on stepped surfaces of the staircase structure and comprising varying heights.

5. The memory device of claim 4, wherein in a top view:
   the staircase structure comprises a first row of stairs and a second row of stairs disposed side-by-side, and
   a first contact via of the contact vias landing on a first step of the first row is staggered with a second contact via of the contact vias landing on a first step of the second row.

6. The memory device of claim 1, further comprising:
   contact vias landing on stepped surfaces of the staircase structure and comprising a same height.

7. The memory device of claim 6, further comprising:
   first conductive lines connected to a first portion of the contact vias, the first portion of the contact vias landing on a first row of stairs of the staircase structure; and
   second conductive lines connected to a second portion of the contact vias, the second portion of the contact vias landing on a second row of stairs of the staircase structure, wherein the second conductive lines are interleaved with the first conductive lines in a side view.

8. The memory device of claim 7, wherein:
   the first conductive lines comprise first lower portions disposed below the alternating stack, and
   the second conductive lines comprise second lower portions disposed at a same level as the first lower portions.

9. The memory device of claim 8, further comprising:
   third conductive lines connected to a third portion of the contact vias, the third portion landing on a first column of stairs of the staircase structure, wherein the first column of stairs is adjacent to and perpendicular to the first row and the second row,
   the third conductive lines comprise third lower portions, and the third lower portions are disposed below the first lower portions and above the substrate.

10. The memory device of claim 8, further comprising:
    third conductive lines connected to a third portion of the contact vias, the third portion landing on a first column of stairs of the staircase structure, wherein the first column of stairs is adjacent to and perpendicular to the first row and the second row, and
    the third conductive lines comprise third lower portions disposed at the same level as the first lower portions and the second lower portions.

11. A semiconductor structure, comprising:
    an interconnect structure disposed over a substrate; and
    a memory device embedded in the interconnect structure and comprising:
      an alternating stack of dielectric layers and word line layers extending in a word line direction, the alternating stack comprising a staircase structure, the staircase structure comprising a first row of stairs and a second row of stairs that extend along the word line direction and are disposed side-by-side, and the first row stepping downward in a first direction, and the second row stepping downward in a second direction opposite to the first direction;
      a data storage layer extending in a stacking direction of the alternating stack to cover the alternating stack; and
      bit lines and source lines spaced apart from one another and extending in the stacking direction of the alternating stack, the bit lines and the source lines contacting the data storage layer through channel layers.

12. The semiconductor structure of claim 11, further comprising:
    first contact vias landing on stepped surfaces of the first row of stairs, wherein the first contact vias comprise varying heights, and
    second contact vias landing on stepped surfaces of the second row of stairs.

13. The semiconductor structure of claim 11, further comprising:
    conductive lines connected to the first row of stairs and the second row of stairs, and lower portions of the conductive lines being disposed below the alternating stack.

14. The semiconductor structure of claim 11, wherein the staircase structure further comprises a column of stairs disposed on a side of the first row of stairs and a side of the second row of stairs in a top view, and the column of stairs steps downward in a third direction different from the first direction and the second direction.

15. The semiconductor structure of claim 14, further comprising:
   first conductive lines connected to the first row of stairs and the second row of stairs, and first lower portions of the first conductive lines being disposed below the alternating stack; and
   second conductive lines connected to the column of stairs, and second lower portions of the second conductive lines being interposed between the first lower portions and the substrate.

16. A semiconductor structure, comprising:
   a memory device over a substrate and comprising:
      dielectric layers and word line layers alternating stacked and form a staircase structure, the staircase structure comprising a first row of stairs and a second row of stairs disposed side-by-side, a descending direction of the first row and a descending direction of the second row being opposite to each other;
      a data storage layer extending in a stacking direction of the dielectric layers and the word line layers;
      bit/source lines extending in the stacking direction of the dielectric layers and the word line layers; and
      channel layers disposed between the data storage layer and the bit/source lines.

17. The semiconductor structure of claim 16, further comprising:
   an interconnect structure disposed over the substrate, wherein the memory device is buried in the interconnect structure.

18. The semiconductor structure of claim 16, the staircase structure further comprises a column of stairs disposed on a side of the first row and a side of the second row in a top view, and the column of stairs steps downward in a direction different from the descending direction of the first row.

19. The semiconductor structure of claim 16, wherein the first row and the second row are arranged side-by-side in a direction which is different from the descending direction of the first row.

20. The semiconductor structure of claim 16, further comprising:
   contact vias connected to stepped surfaces of the first row and comprising varying heights.

* * * * *